(12) United States Patent
Hseih et al.

(10) Patent No.: US 11,037,966 B2
(45) Date of Patent: Jun. 15, 2021

(54) SOLID STATE IMAGE SENSOR WITH ON-CHIP FILTER AND EXTENDED SPECTRAL RESPONSE

(71) Applicant: QUALCOMM Incorporated, San Diego, CA (US)

(72) Inventors: Biay-Cheng Hseih, Irvine, CA (US); Todor Georgiev Georgiev, Sunnyvale, CA (US); Jian Ma, San Diego, CA (US); Sergiu Goma, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 220 days.

(21) Appl. No.: 15/713,217

(22) Filed: Sep. 22, 2017

(65) Prior Publication Data
US 2019/0096932 A1 Mar. 28, 2019

(51) Int. Cl.
*H01L 27/146* (2006.01)
*G01J 1/04* (2006.01)
(Continued)

(52) U.S. Cl.
CPC ...... *H01L 27/14605* (2013.01); *G01J 1/0488* (2013.01); *G01J 1/16* (2013.01); *G01J 3/0205* (2013.01); *G01J 3/0208* (2013.01); *G01J 3/36* (2013.01); *H01L 27/14621* (2013.01); *H01L 27/14625* (2013.01); *H01L 27/14627* (2013.01); *H01L 27/14629* (2013.01); *H01L 27/14634* (2013.01); *H01L 27/14636* (2013.01); *H01L 27/14645* (2013.01); *H01L 31/02165* (2013.01);
(Continued)

(58) Field of Classification Search
CPC .......... H01L 27/1464; H01L 27/14647; H01L 27/14623; H01L 27/14627; H01L 27/14636; H01L 27/14685; H01L 27/14621; H04N 5/332; H04N 5/369; H04N 5/335
See application file for complete search history.

(56) References Cited

U.S. PATENT DOCUMENTS

| 7,646,943 B1 | 1/2010 | Wober |
| 8,569,700 B2 | 10/2013 | Bikumandla |
(Continued)

FOREIGN PATENT DOCUMENTS

JP 2008251985 A 10/2008

OTHER PUBLICATIONS

International Search Report and Written Opinion—PCT/US2018/051640—ISA/EPO—dated Apr. 30, 2019.

*Primary Examiner* — Cynthia Segura
(74) *Attorney, Agent, or Firm* — Pamela K. Soggu

(57) ABSTRACT

Various embodiments are directed to an image sensor that includes a first sensor portion and a second sensor portion. The second sensor portion may be positioned relative to the first sensor portion such that the second sensor portion may initially detect light entering the image sensor, and some of that light passes through the second sensor portion and may be detected by the first sensor portion. In some embodiments, one more optical filters may be disposed within the image sensor. The one or more optical filters may include at least one of a dual bandpass filter disposed above the second photodetector or a narrow bandpass filter disposed between the first photodetector and the second photodetector.

27 Claims, 14 Drawing Sheets

(51) Int. Cl.
  *G01J 3/02* (2006.01)
  *G01J 1/16* (2006.01)
  *G01J 3/36* (2006.01)
  *H01L 31/02* (2006.01)
  *H04N 5/374* (2011.01)
  *H01L 31/0216* (2014.01)

(52) U.S. Cl.
  CPC ...... *H04N 5/374* (2013.01); *G01J 2001/1652* (2013.01); *H01L 27/1464* (2013.01); *H01L 27/14612* (2013.01); *H01L 27/14649* (2013.01)

(56) References Cited

U.S. PATENT DOCUMENTS

| | | |
|---|---|---|
| 9,508,681 B2 | 11/2016 | Wan et al. |
| 9,609,239 B2 | 3/2017 | Chuang et al. |
| 9,749,553 B2 * | 8/2017 | Borthakur ............ H04N 5/332 |
| 2010/0203665 A1 * | 8/2010 | Park .................. H01L 27/14627 438/70 |
| 2013/0057699 A1 * | 3/2013 | Ooki ................. H01L 27/14645 348/164 |
| 2013/0234029 A1 * | 9/2013 | Bikumandla ......... H01L 25/043 250/349 |
| 2015/0053846 A1 * | 2/2015 | Byun ................ H01L 27/14629 250/208.1 |
| 2015/0054962 A1 | 2/2015 | Borthakur et al. |
| 2016/0099280 A1 * | 4/2016 | Huang .................... G02B 5/22 250/208.1 |
| 2016/0322412 A1 * | 11/2016 | Yamamoto ........ H01L 27/14647 |
| 2017/0179177 A1 | 6/2017 | Goma et al. |
| 2018/0006079 A1 * | 1/2018 | Anzagira .......... H01L 27/14645 |
| 2018/0295336 A1 * | 10/2018 | Chen ..................... G01B 11/25 |
| 2019/0115386 A1 * | 4/2019 | Ma ..................... H04N 5/36965 |
| 2019/0189696 A1 * | 6/2019 | Yamaguchi ............ H04N 5/332 |

\* cited by examiner

SOLID STATE IMAGE SENSOR WITH ON-CHIP FILTER AND EXTENDED SPECTRAL RESPONSE

TECHNICAL FIELD

This disclosure relates to an image sensor, and specifically to an image sensor with an on-chip filter having an extended spectral range.

BACKGROUND

Image processing devices, such as digital cameras, smartphones or tablet computers, rely on image sensors to capture images. Image sensors receive light and convert that light into electrical signals. The image processing devices then transform these electrical signals into digital images.

Different types of image sensors are currently available. For example, image processing devices typically utilize either a frontside-illumination (FSI) image sensor or a backside-illumination (BSI) image sensor. An FSI image sensor is typically oriented such that light enters the top of the FSI image sensor and passes through a metal-interconnect layer before striking a light-sensing surface. In contrast, BSI image sensors are oriented to allow light to enter from the top of the BSI image sensor and to strike a light-sensing surface without passing through a metal-interconnect layer of the BSI image sensor. While each of the FSI and BSI image sensors have favorable imaging characteristics, they both have limited spectral responses.

SUMMARY OF THE INVENTION

This disclosure describes various embodiments of an image sensor with extended spectral response including at least one on-chip filter.

Various embodiments may include an image sensor that includes a first sensor portion and a second sensor portion positioned on top of the first sensor portion. In some embodiments, the first sensor portion may include a first photodetector and a first metal-interconnect layer. In such embodiments, the second sensor portion may include a second photodetector and a second metal-interconnect layer. In some embodiments, the image sensor may include at least one of a dual bandpass filter disposed above the second photodetector or a narrow bandpass filter disposed between the first photodetector and the second photodetector.

In some embodiments, the image sensor may be configured to receive light including at least a first portion and a second portion, such that the first portion of the received light includes light within a first wavelength range and the second portion of the received light includes light within a second wavelength range. In some embodiments, the dual bandpass filter may be configured to transmit at least the first portion of the received light and the second portion of the received light. In some embodiments, the narrow bandpass filter may be configured to transmit at least the first portion of the received light. In some embodiments, the first portion of the received light may include infrared or near-infrared light and the second portion of the received light may include visible light.

In some embodiments, the first photodetector may be configured to receive at least the first portion of the received light and the second photodetector may be configured to receive at least the second portion of the received light. In some embodiments, the first photodetector may be configured to convert the at least first portion of the received light into a first electrical signal and the second photodetector may be configured to convert the at least second portion of the received light into a second electrical signal.

In some embodiments, the image sensor may be included within a device. The device may include a processor coupled to the image sensor. The processor may be configured to generate a first digital signal from the first electrical signal. The processor may further be configured to generate a second digital signal from the second electrical signal. The processor may further be configured to generate a combined digital signal from the first digital signal and the second digital signal. The processor may further be configured to generate a digital image based at least in part on the combined digital signal.

In some embodiments, the first sensor portion may include a first light pipe formed within the first metal-interconnect layer and the second sensor portion may include a second light pipe formed within the second metal-interconnect layer. The first and second light pipes may be configured to guide the received light from the second photodetector to the first photodetector. In some embodiments, the narrow bandpass filter may be disposed between the first light pipe and the second light pipe.

In some embodiments, the first light pipe may include a first width and the second light pipe may include a second width smaller than the first width.

In some embodiments, the first light pipe may be coupled to a first inner micro-lens and the second light pipe may be coupled to a second inner micro-lens positioned on top of the first inner micro-lens. In some embodiments, the first inner micro-lens may be enclosed within a first substance having a flat or substantially flat surface and the second inner micro-lens may be enclosed within a second substance having a flat or substantially flat surface positioned on top of the flat or substantially flat surface of the first substance. In some embodiments, the narrow bandpass filter may be disposed between the first substance and the second substance. In some embodiments, the narrow bandpass filter may be disposed on top of the first light pipe and below the first inner micro-lens.

In some embodiments, the image sensor may include a color filter disposed above the second photodetector.

Various embodiments may include a method for capturing an image via an image sensor. In some embodiments, the method may include transmitting a source light via an optical transmitter. The method may also include receiving light, including reflections of the source light, via an optical receiver. In some embodiments, the optical receiver may include an image sensor. The image sensor may include a first sensor portion and a second sensor portion positioned on top of the first sensor portion. In some embodiments, the first sensor portion may include a first photodetector and a first metal-interconnect layer. In such embodiments, the second sensor portion may include a second photodetector and a second metal-interconnect layer. In some embodiments, the image sensor may include at least one of a dual bandpass filter disposed above the second photodetector or a narrow bandpass filter disposed between the first photodetector and the second photodetector.

In some embodiments, the received light may include at least a first portion and a second portion, such that the first portion of the received light includes light within a first wavelength range and the second portion of the received light includes light within a second wavelength range. In some embodiments, the dual bandpass filter may be configured to transmit at least the first portion of the received light and the second portion of the received light. In some embodiments, the narrow bandpass filter may be configured to transmit at least the first portion of the received light. In some embodiments, the first portion of the received light may include infrared or near-infrared light and the second portion of the received light may include visible light.

In some embodiments, the first photodetector may be configured to receive at least the first portion of the received light and the second photodetector may be configured to receive at least the second portion of the received light. In some embodiments, the first photodetector may be configured to convert the at least first portion of the received light into a first electrical signal and the second photodetector may be configured to convert the at least second portion of the received light into a second electrical signal.

In some embodiments, the optical transmitter and the optical receiver may be included within a device. The device may include a processor coupled to the image sensor. The processor may be configured to generate a first digital signal from the first electrical signal. The processor may further be configured to generate a second digital signal from the second electrical signal. The processor may further be configured to generate a combined digital signal from the first digital signal and the second digital signal. The processor may further be configured to generate a digital image based at least in part on the combined digital signal.

In some embodiments, the first sensor portion may include a first light pipe formed within the first metal-interconnect layer and the second sensor portion may include a second light pipe formed within the second metal-interconnect layer. The first and second light pipes may be configured to guide the received light from the second photodetector to the first photodetector. In some embodiments, the narrow bandpass filter may be disposed between the first light pipe and the second light pipe.

In some embodiments, the first light pipe may include a first width and the second light pipe may include a second width smaller than the first width.

In some embodiments, the first light pipe may be coupled to a first inner micro-lens and the second light pipe may be coupled to a second inner micro-lens positioned on top of the first inner micro-lens. In some embodiments, the first inner micro-lens may be enclosed within a first substance having a flat or substantially flat surface and the second inner micro-lens may be enclosed within a second substance having a flat or substantially flat surface positioned on top of the flat or substantially flat surface of the first substance. In some embodiments, the narrow bandpass filter may be disposed between the first substance and the second substance. In some embodiments, the narrow bandpass filter may be disposed on top of the first light pipe and below the first inner micro-lens.

In some embodiments, the image sensor may include a color filter disposed above the second photodetector.

Various embodiments may include an apparatus for capturing an image via an image sensor. In some embodiments, the apparatus may include means for transmitting a source light via an optical transmitter. The apparatus may also include means for receiving light, including reflections of the source light, via an optical receiver. In some embodiments, the optical receiver may include an image sensor. The image sensor may include a first sensor portion and a second sensor portion positioned on top of the first sensor portion. In some embodiments, the first sensor portion may include a first photodetector and a first metal-interconnect layer. In such embodiments, the second sensor portion may include a second photodetector and a second metal-interconnect layer. In some embodiments, the image sensor may include at least one of a dual bandpass filter disposed above the second photodetector or a narrow bandpass filter disposed between the first photodetector and the second photodetector.

DETAILED DESCRIPTION

Figure 1:
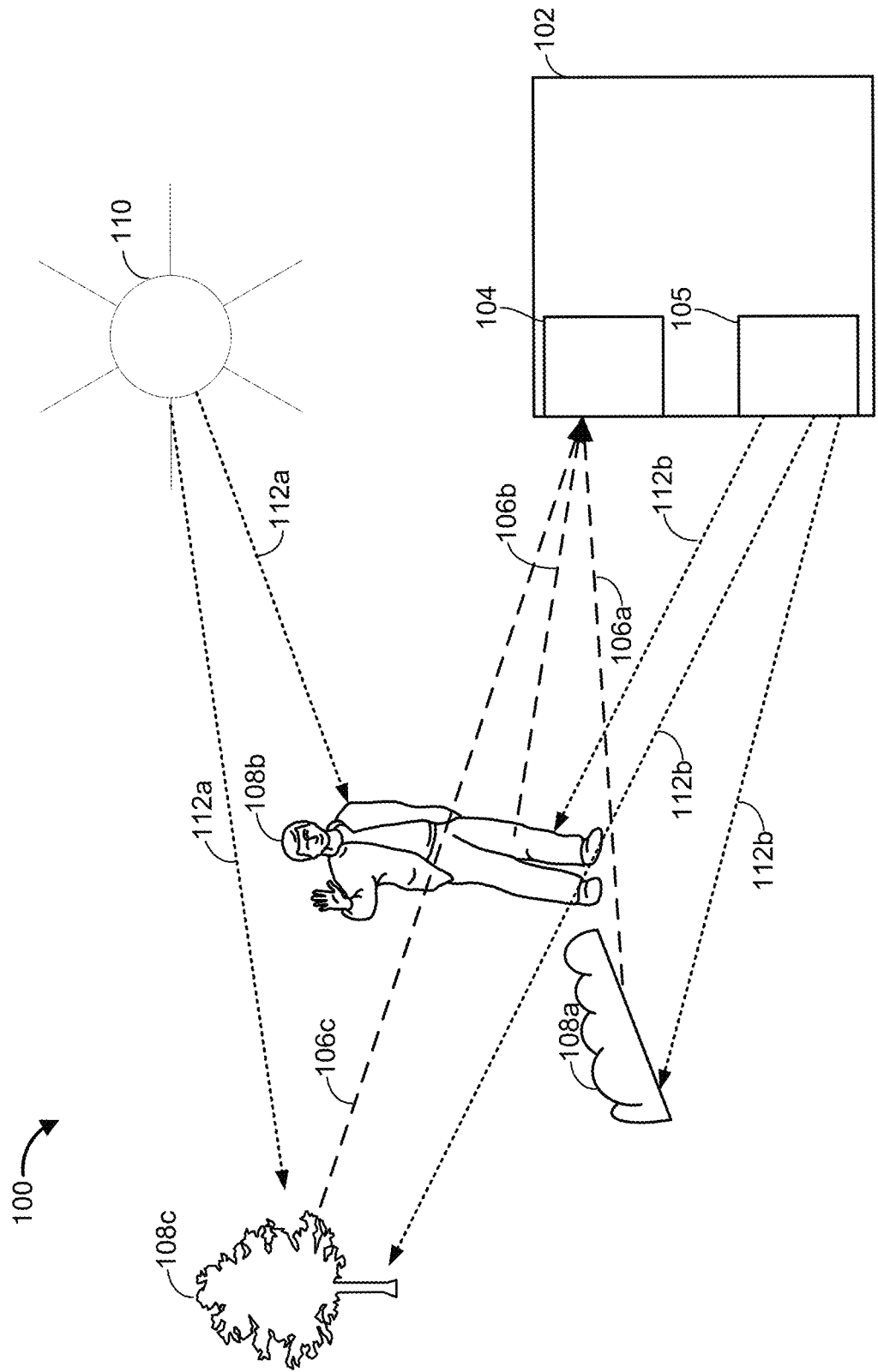
FIG. 1 is an example diagram illustrating a device and a scene including a field of view of the device.

As described herein, some components of an image sensor (e.g., an FSI or BSI image sensor) may sometimes be referred to as positioned "above," "on top of," "underneath", "below," or similar terminology in relation to some other components. For ease of description, spatial relations between components in an image sensor may be described in relation to the "top" and "bottom" of the image sensor. In some embodiments, the "top" of an image sensor may correspond with the point at which light initially strikes and/or enters the image sensor. Accordingly, the "bottom" of the image sensor may be on the opposite side of the image sensor than the top of the image sensor. Thus, a second component or element of an image sensor that is closer to the top of the image sensor than a first component may be described as being "on top of" or "above" the first component.

In embodiments described herein, certain references to an image sensor as having a "first sensor portion" (or a "first image sensor") or a "second sensor portion" (or a "second image sensor") is merely for ease of labeling and description. As such, the description of an image sensor as a "first sensor portion" or a "second image sensor" is not intended to be limiting.

The term "sensor element" may be used herein to refer to a basic component of an image sensor that may be configured to capture light information. Specifically, a sensor element may be configured to capture a portion of a photographic object such that a representation of the entire photographic image (or a larger portion) may be captured using multiple sensor elements of the image sensor. The image sensor may be described as including or having one or more sensor elements arranged as a two-dimensional array or matrix. This two-dimensional array may correspond with a particular resolution of a related digital image. More sensor elements typically correspond with higher-resolution digital images. For example, an image processing device with an image sensor having a 640×480 array of sensor elements (e.g., a 0.3 megapixel image sensor) may capture lower resolution digital images than another image processing device with an image sensor having a 4000×3000 array of sensor elements (e.g., a 12 megapixel image sensor). Any reference to an image sensor having a certain number of sensor elements is simply for ease of description and is not intended to limit any image sensor to have any particular number of sensor elements, unless otherwise indicated.

Silicon wafers used in a conventional backside-illumination (BSI) image sensor may be thin enough such that light enters from the top of the BSI wafer and strikes a light receiving surface (e.g., a photodetector) without passing through a metal-interconnect layer of the BSI image sensor. Because light does not pass through the metal-interconnect layer in a BSI wafer (e.g., BSI image sensor), light is not scattered or obstructed to the same degree as observed in frontside-illumination (FSI) image sensors. Thus, BSI image sensors generally experience better performance when detecting visible light than FSI image sensors. However, because BSI image sensors are thinner than FSI image sensors (e.g., BSI image sensors are typically less than three micrometers while FSI image sensors are typically greater than seven micrometers), BSI image sensors may not detect near-infrared ("NIR") or infrared ("IR") light as well as FSI image sensors due to the relatively longer wavelengths of NIR/IR light.

In overview, various embodiments provide for an image sensor configured to sense visible light on par with a BSI image sensor, while simultaneously being configured to sense IR or NIR light on par with an FSI image sensor. In such embodiments, the image sensor may include a first sensor portion (which may also be referred to as a first image sensor) configured to function similar to an FSI image sensor. The image sensor may further include a second sensor portion (which may be referred to as a second image sensor) configured to function similar to a BSI image sensor. The second sensor portion may be positioned on top of (e.g., coupled, attached, bonded, etc.) to the first sensor portion. The first sensor portion being configured to function similar to an FSI image sensor and the second sensor portion being configured to function similar to a BSI image sensor are for exemplary purposes only and are not meant to be a limitation of this disclosure. For example, the first sensor portion may be configured to function similar to a BSI image sensor and the second sensor portion may be configured to function similar to an FSI image sensor. Alternatively, the first sensor portion and the second sensor portion may both be configured to function similar to a BSI image sensor or the first sensor portion and the second sensor portion may both be configured to function similar to an FSI image sensor.

In various embodiments, the image sensor may be configured such that the second sensor portion is positioned on top of the first sensor portion. "Top" may be used to refer to a position such that light may enter the second sensor portion and be detected, and some of that light may pass through the second sensor portion and may be detected within the first sensor portion. By positioning the second sensor portion on top of the first sensor portion, a stacked image sensor may be formed. In some embodiments, the second sensor portion may be configured to have a thickness suitable for sensing visible light, such as by performing wafer thinning or grinding. The first sensor portion may be configured to have a thickness suitable for sensing IR or NIR light, which may not require wafer grinding or may require a lesser degree of grinding. By positioning the second sensor portion above the first sensor portion such that each sensor portion is able to capture some light from the same source (e.g., from the same direction and/or same environment), the overall light captured by the image sensor may be improved.

In some embodiments, the image sensor may include one or more optical filters. The one or more optical filters may include one or more of a dual bandpass filter disposed above a second photodetector of the second sensor portion. The one or more optical filters may include one or more of an IR or NIR narrow bandpass filter disposed between a first photodetector of the first sensor portion and the second photodetector of the second sensor portion. Optical bandpass filters are typically configured to selectively transmit wavelengths within a certain range while rejecting wavelengths outside of that range. Dual bandpass filters are typically configured to transmit two passbands (e.g., two portions of the spectrum, such as visible light and NIR/IR light). By positioning a dual bandpass filter above the second photodetector (e.g., the dual bandpass filter may be disposed anywhere above the second photodetector, such as on top of the second sensor portion), the dual bandpass filter may transmit visible and NIR/IR light while rejecting light outside of the one or more wavelength ranges associated with visible and/or NIR/IR light. The light, having been filtered by the dual bandpass filter, may then enter the second sensor portion of the image sensor. In this manner, only light within wavelength ranges associated with the dual bandpass filter may enter the image sensor (e.g., the second sensor portion) via the dual bandpass filter, such as visible light and NIR/IR light.

Narrow bandpass filters are typically configured to transmit a narrow region of the spectrum (e.g., a narrow region of the NIR or IR spectrum when using an IR or NIR narrow bandpass filter) while rejecting light outside of the narrow region of the spectrum (e.g., rejecting visible light if the narrow bandpass filter is an IR or NIR narrow bandpass filter). By disposing a narrow bandpass filter between the first photodetector of the first sensor portion and the second photodetector of the second sensor portion (e.g., the narrow bandpass filter may be disposed anywhere between the first photodetector and the second photodetector), the narrow bandpass filter may filter light that was not sensed by the second sensor portion (e.g., light that was not detected by the second photodetector) prior to the light entering the first photodetector. For example, the narrow bandpass filter may transmit light within a narrow wavelength range while rejecting light outside of the narrow wavelength range. The light, having been filtered by the narrow bandpass filter, may then enter and be detected by the first photodetector. In this manner, only light within a narrow wavelength range may enter and be detected by the first photodetector of the image sensor via the narrow bandpass filter, such as NIR and/or IR light.

In some embodiments, the first sensor portion and the second sensor portion of the image sensor may each have one or more sensor elements. The first sensor portion and the second sensor portion may be physically coupled or affixed together in such a way that each sensor element of the first sensor portion is aligned with a corresponding sensor element of the second sensor portion. Specifically, each sensor element of the first sensor portion may be positioned below a corresponding sensor element of the second sensor portion. In an example in which each of the first sensor portion and the second sensor portion has two sensor elements (e.g., a 2×1 sensor array), a first sensor element of the first sensor portion may be aligned with a corresponding sensor element (referred to as a second sensor element because the corresponding sensor element may be included within the second sensor portion) of the second sensor portion.

In some embodiments, the alignment of sensor elements of the first and second sensor portions may include aligning photodetectors and light pipes in the first and second sensor portions of the image sensor (e.g., as discussed with reference to FIG. 3), which may ensure that light from the same source is captured or sensed by corresponding sensor elements in the image sensor. In such embodiments, this configuration of the image sensor may enable a photodetector in the second sensor portion (referred to herein as a second photodetector because it is included within the second sensor portion) to receive visible light from a source and may also enable a corresponding photodetector in the first sensor portion (referred to herein as a first photodetector because it is included within the first sensor portion) to receive NIR or IR light from the same source. The configuration and alignment of the first and second sensor portions of the image sensor facilitates the capture of light from the same source using two photodetectors (e.g., the first photodetector and the second photodetector). As a result, the digital images created from the light captured with these photodetectors may have a higher degree of detail, particularly in low-light situations.

In some embodiments, the first sensor portion and the second sensor portion of the image sensor may be physically coupled or affixed together by bonding a first metal-interconnect layer of the first sensor portion and a second metal-interconnect layer of the second sensor portion to form a combined metal-interconnect layer. For example, the first and second metal-interconnect layers of the first and second sensor portions may be coupled by applying a metal-oxide adhesive. In another example, the first and second metal-interconnect layers of the first and second sensor portions may be coupled via Van der Waals force, such that a top portion of the first metal-interconnect layer of the first sensor portion (e.g., a top portion or top surface of the first metal-interconnect layer of the first sensor portion) and a bottom portion of the second metal-interconnect layer of the second sensor portion (e.g., a bottom portion or bottom surface of the second metal-interconnect layer of the second sensor portion) that are coupled to form the combined metal-interconnect layer may be smooth surfaces such that when the two respective surfaces come in contact, no air may be found between the two surfaces and the first sensor portion and the second sensor portion may be bonded to form the combined metal-interconnect layer.

Various embodiments will be described in detail with reference to the accompanying drawings. Generally, the same reference numbers will be used throughout the drawings to refer to the same or similar part. References made to particular examples and implementations are for illustrative purposes only, and are not intended to limit the scope of the disclosure or the claims.

In some embodiments, the image sensor described herein may detect light within the visible range or near infrared ("NIR") or longer wavelength light (for example, infrared ("IR"), etc.). For clarity of description, "NIR light" will refer to any light with a wavelength within the NIR range and/or having a wavelength longer than NIR light.

FIG. 1 is a diagram illustrating a scene, a device 102, and various objects within the scene and within a field of view of the device 102. As shown in FIG. 1, the device 102 may include an optical receiver 104 and an optical transmitter 105. Examples of device 102 may include an image capture device, such as a camera, that may be or may be part of a desktop computer, a laptop computer, a tablet, a personal digital assistant, a personal camera, a digital camera, an action camera, a mounted camera, a connected camera, a wearable device, an automobile, a drone, a wireless communication device, a phone, a television, a display device, a digital media player, a video game console, or a video streaming device. Device 102 may be capable of capturing still or moving images, regardless of format (e.g., digital, film, etc.) or type (e.g., video camera, still camera, web camera, etc.).

Examples of optical transmitter 105 may include a projector, a laser, or the like. Examples of optical receiver 104 may include one or more optical sensors (e.g., image sensors). In some examples, optical transmitter 105 may transmit a source light (e.g., IR light, NIR, light, structured light that includes a pattern or codeword, a flash, etc.) into the scene and the optical receiver 104 may receive visible light and/or the source light reflected off of objects within the scene.

The field of view ("FOV") of device 102 may include objects 108a-c, including a bush 108a, a person 108b, and a tree 108c. The scene 100 may include an external light source 110 independent from the device 102. Example external light sources 110 may include a natural light source (e.g., the sun) or an artificial light source external from device 102. Reflected light 106a-c may represent paths of light reflected off of objects 108a-c, respectively. Emitted light 112a may represent paths of light emitted from external light source 110. Emitted light 112b may represent paths of a source light transmitted from optical transmitter 105.

Optical receiver 104 may sense light (e.g., visible signals, IR signals, and/or NIR signals), for example via optics of device 102 not shown in this figure, and thus capture an image of the FOV of device 102 based on the sensed light. The light received by optical receiver 104 may include reflections of the source light transmitted via optical transmitter 105. The light received by optical receiver 104 may include light from external light source 110 and/or reflections of light from external light source 110. In other words, optical receiver 104 may absorb the emitted light from external light source 110 directly or after it reflects off of objects 108a-c within the FOV of device 102. In some embodiments, optical transmitter 105 may transmit source light 112b when device 102 is used to capture an image. In other embodiments, the optical transmitter 105 may provide constant illumination for the duration of a sensing period of optical receiver 104. In some embodiments, optical receiver 104 and optical transmitter 105 may be two independent (e.g., separate) components that are configured to operate together. Optical receiver 104 may be configured to generate an image of the FOV based on the received light.

As with optical transmitter 105, external light source 110 may function independently of device 102 (for example, as a constantly illuminated source such as the sun) or may function dependent upon device 102 (for example, as an external flash device). For example, external light source 110 may include an exterior light that constantly emits emitted light 112a within the FOV of device 102 or in a portion of the FOV of device 102.

Device 102 may be capable of determining depth of a scene or depth of an object based on light received at optical receiver 104. The example embodiment of FIG. 1 shows optical receiver 104 receiving reflected light 106a-c from objects 108a-c within the FOV of device 102. As shown, objects 108a-c may be at various depths from device 102. However, in some embodiments, objects 108a-c may be at a single depth from device 102.

Figures 2A, 2B:
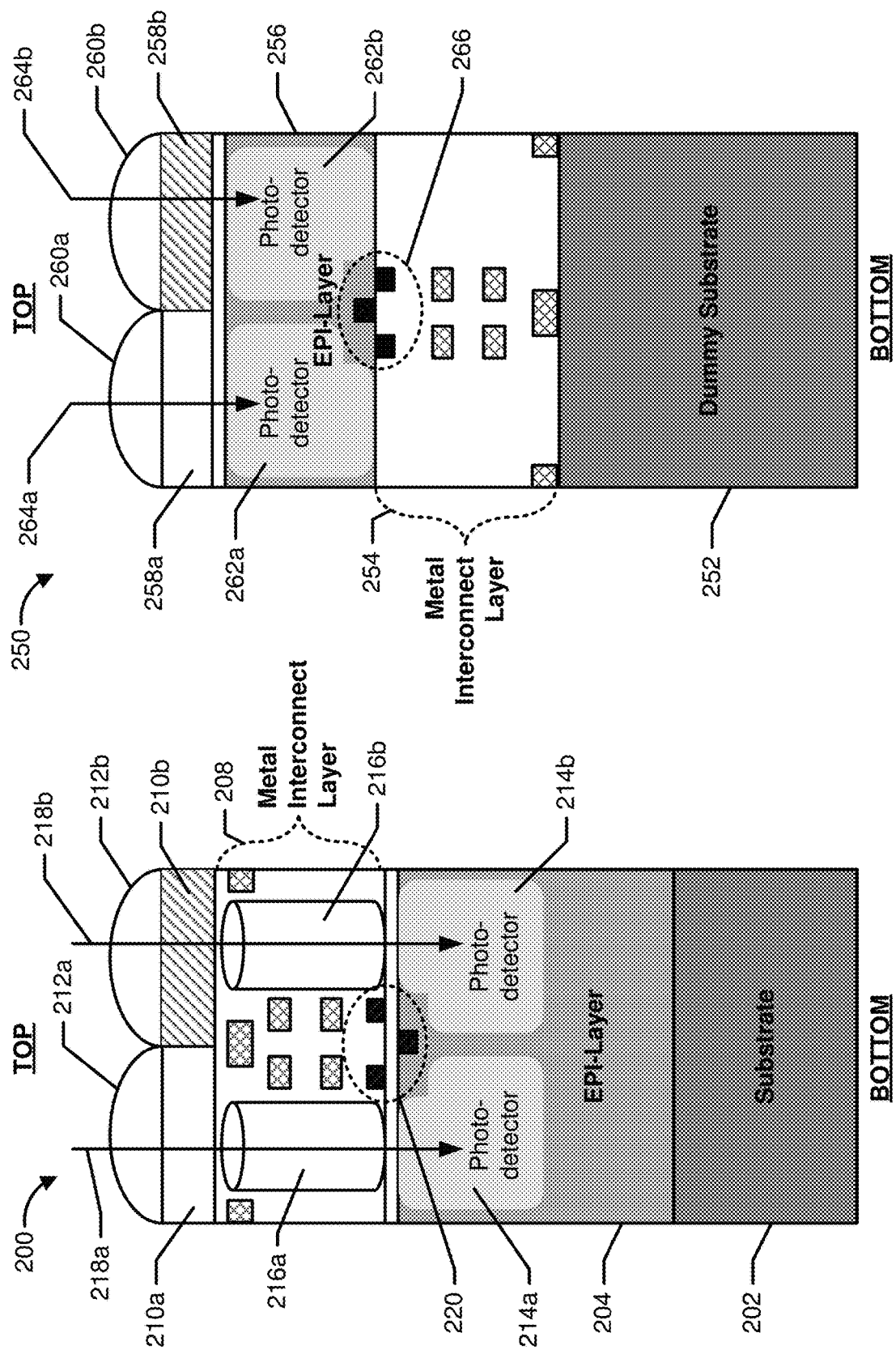
FIG. 2A is a component diagram showing a cross-sectional view of a frontside-illuminated image sensor.
FIG. 2B is a component diagram showing a cross-sectional view of a backside-illuminated image sensor.

FIG. 2A is a side view of a cross-section of an example embodiment of an FSI image sensor 200. In this example, FSI image sensor 200 may include a substrate layer 202, an epitaxial layer 204, a metal-interconnect layer 208, and one or more micro-lenses (e.g., micro-lenses 212a and 212b). In some embodiments intended to capture color images, FSI image sensor 200 may include one or more color filters (e.g., color filters 210a and 210b). It should be noted that one or more color filters 210a and 210b are optional, as FSI image sensor 200 may not be intended to capture color images. For example, color filters 210a and 210b may not be necessary to capture black and white images.

FSI image sensor 200 may be oriented such that light (e.g., light 218a or 218b) may enter from the top of FSI image sensor 200. In the example illustrated in FIG. 2A, light 218a or 218b may enter FSI image sensor 200 via micro-lenses 212a and 212b, which focus the light 218a or 218b. Light 218a and 218b may then pass through color filters 210a, 210b. In particular, color filters 210a, 210b may block light in certain wavelengths (e.g., certain colors) such that light that passes through color filters 210a, 210b may have a particular color or may be associated with a particular range of wavelengths or colors.

After being focused by micro-lenses 212a, 212b and filtered by color filters 210a, 210b, light 218a or 218b may pass through metal-interconnect layer 208—usually through one or more light pipes 216a and 216b—to be received by one or more photodetectors 214a and 214b included within epitaxial layer 204. Light pipes 216a and 216b may be embedded (e.g., formed) in metal-interconnect layer 208 and may facilitate the passage of light 218a and 218b through metal-interconnect layer 208 by restricting light 218a and 218b within light pipes 216a and 216b. As a result, portions of light 218a and 218b may avoid passing directly through metal-interconnect layer 208, which may otherwise cause some of light 218a and 218b to be scattered or obstructed.

After passing through light pipes 216a and 216b, light 218a and 218b may strike photodetectors 214a and 214b, which may be configured to detect light 218a and 218b. Photodetectors 214a and 214b may convert the light energy of light 218a and 218b into electrical energy. This electrical energy may be passed to metal-interconnect layer 208 via a metal-oxide-semiconductor field-effect transistor (e.g., MOSFET 220). The metal-oxide semiconductor field-effect transistor (e.g., MOSFET 220) may drive the electrical energy to one or more processors or other components (not shown) that convert the electrical energy into a digital signal that may be combined with other digital signals to form a digital image. Generally described, each of photodetectors 214a and 214b may correspond with a different sensor element in FSI image sensor 200. As such, FSI image sensor 200 illustrated in FIG. 2A may be characterized as showing two sensor elements corresponding to photodetectors 214a and 214b.

Photodetectors 214a and 214b may be included or embedded in epitaxial layer 204. Epitaxial layer 204 may typically be made from gallium nitride, or some combination of gallium, indium, aluminum, nitrogen, phosphorus, or arsenic. In the example illustrated in FIG. 2A, epitaxial layer 204 may be formed on top of substrate layer 202 through the process of epitaxy growth from substrate layer 202. Substrate layer 202 may be made from various semiconductor materials, such as crystalline silicon. In some instances, epitaxial layer 204 may be made from the same or another material as substrate layer 202. In some instances, epitaxial layer 204 may be a boron-doped, p-type semiconductor material.

FIG. 2B is a side view of a cross-section of an example embodiment of a BSI image sensor 250. In the illustrated example, BSI image sensor 250 may include a dummy substrate layer 252, a metal-interconnect layer 254, an epitaxial layer 256, and one or more micro-lenses 260a and 260b. In some embodiments intended to capture color images, BSI image sensor 250 may include one or more color filters (e.g., color filters 258a and 258b). It should be noted that one or more color filters 258a and 258b are optional, as BSI image sensor 250 may not be intended to capture color images. For example, color filters 258a and 258b may not be necessary to capture black and white images.

Some components of BSI image sensor 250 may be similar to and may be used for similar purposes to the components described with reference to FSI image sensor 200. However, unlike FSI image sensors (e.g., FSI image sensor 200) that require light to pass through a metal-interconnect layer (e.g., metal-interconnect layer 20 of FSI image sensor 200), BSI image sensor 250 may be configured to sense light (e.g., via one or more photodetectors 262a and 262b) before the light passes through metal-interconnect layer 254 of BSI image sensor 250.

In the example illustrated in FIG. 2B, light 264a and 264b may be received from the top of BSI image sensor 250. As described with reference to FSI image sensor 200, light 264a and 264b may pass, respectively, through micro-lenses 260a and 260b, which may focus the light 264a and 264b, and through color filters 258a and 258b, which may filter out certain colors or wavelengths in light 264a and 264b. However, in contrast to the above description of FSI image sensor 200, light 264a and 264b may pass through color filters 258a and 258b and may be received by photodetectors 262a and 262b embedded within epitaxial layer 256. As such, light 264a and 264b may be sensed by photodetectors 262a and 262b without having to pass through metal-interconnect layer 254 because, as shown in FIG. 2B, photodetectors 262a and 262b are included within BSI image sensor 250 on top of metal-interconnect layer 254. Metal-interconnect layer 254 of BSI image sensor 250 may be positioned underneath epitaxial layer 256 and may be in electrical contact with epitaxial layer 256 via a MOSFET 266.

Epitaxial layer 256 of BSI image sensor 250 may be similar to epitaxial layer 204 of FSI image sensor 200, except epitaxial layer 256 may have been grinded (thinned) such that light entering from the top of BSI image sensor 250 strikes a light receiving surface (e.g., photodetector 262a,

262*b*) without passing through metal-interconnect layer 254. Because light does not pass through the wiring of metal-interconnect layer 254 in BSI image sensor 250, light may not be scattered or obstructed to the same degree as observed in FSI image sensor 200. Further, due to the position of photodetectors 262*a* and 262*b* above metal-interconnect layer 254, BSI image sensor 250 may not require light pipes to channel the light deeper into BSI image sensor 250, in contrast to FSI image sensor 200 described above. Thus, BSI image sensor 250 may generally experience better performance when detecting visible light than FSI image sensors e.g., FSI image sensor 200). However, as noted above, the thin configuration that enables BSI image sensor 250 to capture visible light effectively also results in impairment in the ability of BSI image sensor 250 to capture NIR or IR light as well as FSI image sensor 200. Specifically, because epitaxial layer 256 of BSI image sensor 250 is thinner than epitaxial layer 204 of FSI image sensor 200, BSI image sensor 250 may not be able to detect NIR or IR light as well as FSI image sensor 200 due to the relatively longer wavelengths of NIR/IR light.

Various embodiments described herein are directed to a stacked image sensor that improves conventional BSI and FSI image sensors. The stacked image sensor may provide superior visible and/or NIR/IR light detection abilities than an individual BSI image sensor and/or an individual FSI image sensor. The stacked image sensor described herein may include features similar to a BSI image sensor (or two BSI image sensors) and/or an FSI image sensor (or two FSI image sensors), as well as additional features, in a single image sensor.

Figure 3:
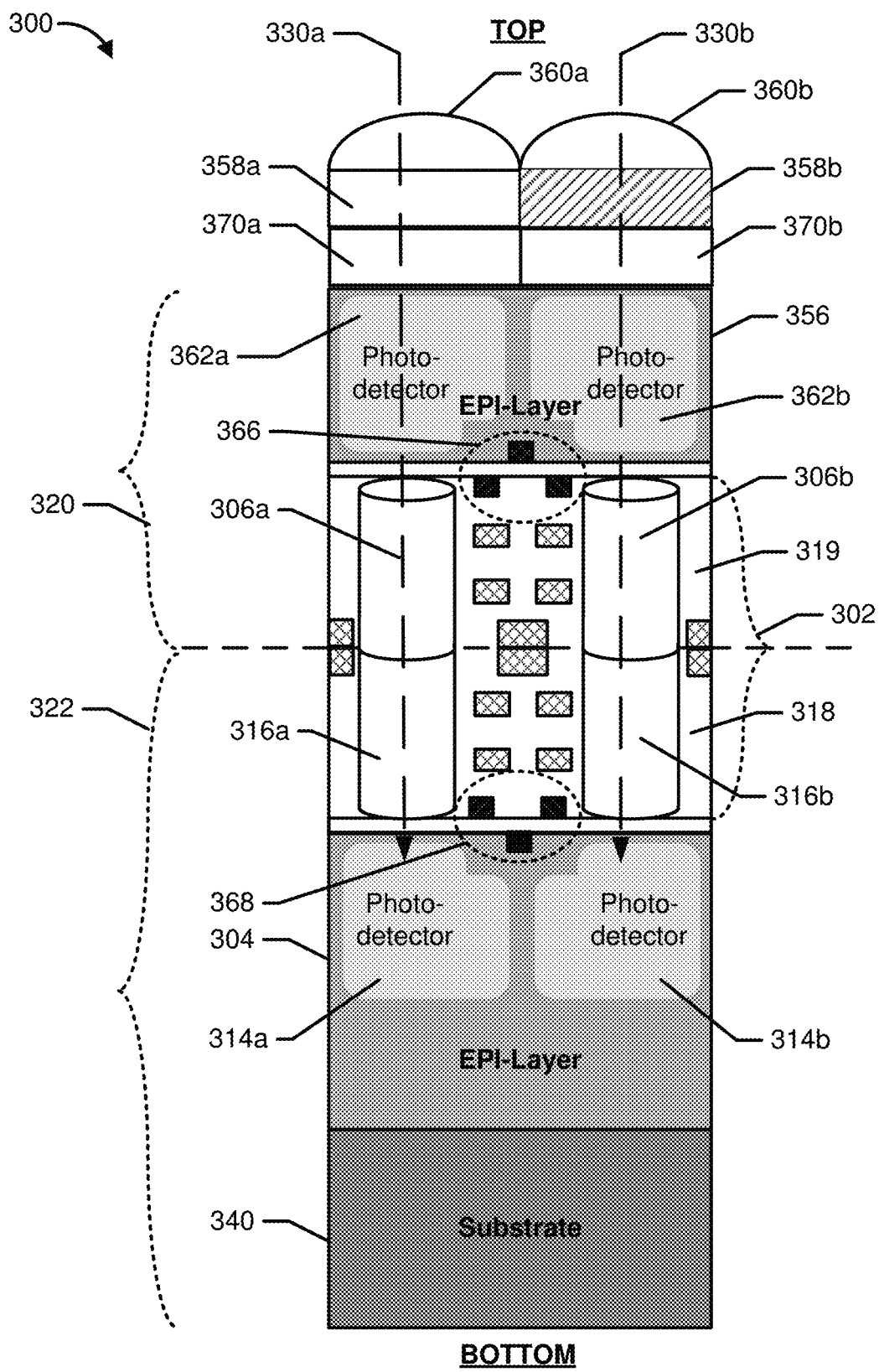
FIG. 3 is a component block diagram showing a cross-sectional view of an image sensor including a dual bandpass filter, according to some embodiments.

FIG. 3 illustrates a side view of a cross-section of an exemplary embodiment of image sensor 300. Generally described, image sensor 300 may represent a combination of some aspects of a BSI image sensor (e.g., BSI image sensor 250 of FIG. 2B) and/or an FSI image sensor (e.g., FSI image sensor 200 of FIG. 2A), whereby components corresponding to a BSI image sensor (e.g., second sensor portion 320) may be positioned on top of components corresponding to a FSI image sensor (e.g., first sensor portion 322).

Image sensor 300 may include first sensor portion 322, second sensor portion 320, and combined metal-interconnect layer 302. First sensor portion may include first substrate 340, first epitaxial layer 304, first photodetectors 314*a* and 314*b* (each corresponding to a sensor element of image sensor 300), first MOSFET 368, first metal-interconnect layer 318, and first light pipes 316*a* and 316*b* (each corresponding to a sensor element of image sensor 300). Second sensor portion 320 may include second epitaxial layer 356, second photodetectors 362*a* and 362*b* (each corresponding to a sensor element of image sensor 300), second MOSFET 366, second metal-interconnect layer 319, and second light pipes 306*a* and 306*b* (each corresponding to a sensor element of image sensor 300).

Image sensor 300 may include micro-lenses 360*a* and 360*b*. In some embodiments intended to capture color images, image sensor 300 may include color filters 358*a* and 358*b*. Image sensor 300 may include one or more optical filters 370*a* and 370*b*. The one or more optical filters may include any optical filters including, but not limited to, interference filters, dichroic filters, absorptive filters, monochromatic filters, infrared filters, ultraviolet filters, longpass filters, bandpass filters, shortpass filters, and/or other optical filters. As described above, dual bandpass filters may be configured to transmit two passbands (e.g., two portions of the spectrum, such as visible light and NIR/IR light). For exemplary purposes only, optical filters 370*a* and 370*b* may be referred to as dual bandpass filters disposed within image sensor 300, but is not meant to be a limitation of this disclosure. Example dual bandpass filters include DB940, DB850, and/or other dual bandpass filters. In some embodiments, optical filters 370*a* and 370*b* may refer to narrow bandpass filters, infrared filters, near-infrared filters, or any other optical filter. In some embodiments, optical filter 370*a* may refer to one type of optical filter while optical filter 370*b* may refer to a second type of optical filter different from the first type of optical filter.

Light 330*a* and 330*b*, prior to being received by image sensor 300, may include reflections of a source light (for example, a source light transmitted via optical transmitter 105 of FIG. 1) and/or may include light from an external light source (reflected or directly). Light 330*a* and 330*b* may include a first portion which may include light within a first wavelength range (e.g., a wavelength range associated with NIR/IR light) and a second portion which may include light within a second wavelength range (e.g., a wavelength range associated with visible light). The first and second wavelengths ranges may be different and/or portions of the first and second wavelength ranges may overlap. By disposing optical filters 370*a* and 370*b* (e.g., for example, dual bandpass filters) above second photodetectors 362*a* and 362*b* (e.g., on top of second sensor portion 320), optical filters 370*a* and 370*b* may be configured to transmit a first portion of light 330*a* and 330*b* and a second portion of light 330*a* and 330*b* within wavelength ranges associated with optical filters 370*a* and 370*b* while rejecting light outside of the wavelength ranges associated with optical filters 370*a* and 370*b*.

Optical filters 370*a* and 370*b* may be coated or embedded above second photodetectors 362*a* and 362*b* (e.g., within a top portion of second sensor portion 320), such that optical filters 370*a* and 370*b* may be considered "on-chip" of image sensor 300. Materials of optical filters 370*a* and 370*b* are not particularly limited as long as the materials of optical filters 370*a* and 370*b* may transmit light within wavelengths suitable for image sensor 300. For example, at least one of the wavelength ranges associated with optical filters 370*a* and 370*b* may correspond to a wavelength of the source light transmitted via optical transmitter 105 of FIG. 1. Light 330*a* and 330*b*, having been filtered by optical filters 370*a* and 370*b*, may then enter second sensor portion 320. In this manner, only light within wavelength ranges associated with optical filters 370*a* and 370*b* may enter second sensor portion 320 via optical filters 370*a* and 370*b*, such as visible light and/or NIR/IR light.

While FIG. 3 is shown as image sensor 300 having optical filters 370*a* and 370*b* disposed immediately or directly beneath color filters 358*a* and 358*b* and immediately or directly on top of second photodetector 362*a* and 362*b*, this is for exemplary purposes only and is not meant to be a limitation of this disclosure. Optical filters 370*a* and 370*b* (e.g., dual bandpass filters) may be disposed anywhere above second photodetectors 362*a* and 362*b* such that light 330*a* and 330*b* is filtered prior to entering second photodetectors 362*a* and 362*b*. For example, in another example embodiment, optical filters 370*a* and 370*b* may be disposed immediately or directly beneath micro-lenses 360*a* and 360*b* and immediately or directly on top of color filters 358*a* and 358*b*. In some embodiments, optical filters 370*a* and 370*b* may only be included within image sensor 300 when color filters 358*a* and 358*b* are included within image sensor 300. In other embodiments, image sensor 300 may include optical filters 370*a* and 370*b* without color filters 358*a* and 358*b*. In other embodiments, optical filters 370*a* and 370*b* may be disposed above micro-lenses 360*a* and 360*b*. In such an embodiment, micro-lenses 360*a* and 360*b* may be encased within a substance having a low index such that the substance may form a flat or substantially flat surface for optical filters 370*a* and 370*b* to be disposed immediately or directly on top of or immediately or directly below the flat or substantially flat surface encasing micro-lenses 360*a* and 360*b*.

As described above (e.g., with reference to FIG. 2B), micro-lenses 360*a* and 360*b* may be configured to focus light 330*a* and 330*b* entering the top of image sensor 300, color filters 358*a* and 358*b* may be configured to selectively filter out certain colors of light 330*a* and 330*b*, and optical filters 370*a* and 370*b* may be configured to selectively filter out certain wavelengths of light 330*a* and 330*b* while transmitting certain wavelengths of light 330*a* and 330*b*. Second sensor portion 320 of image sensor 300 may include second epitaxial layer 356, which may have been grinded or thinned to a thickness that is suitable for receiving visible light. For example, second epitaxial layer 356 may have a thickness of approximately three to five micrometers. Second epitaxial layer 356 may include second photodetectors 362*a* and 362*b*. Second photodetectors 362*a* and 362*b* may be configured to receive at least the first portion of light 330*a* and 330*b* that has passed through micro-lenses 360*a* and 360*b*, optional color filters 358*a* and 358*b*, and optical filters 370*a* and 370*b*. Second epitaxial layer 356 may be in electrical contact with combined metal-interconnect layer 302 via second MOSFET 366.

In some embodiments, combined metal-interconnect layer 302 of image sensor 300 may be fabricated by affixing or bonding a bottom portion of second metal-interconnect layer 319 of second sensor portion 320 to a top portion of first metal-interconnect layer 318 of first sensor portion 322. For example, the bottom of metal-interconnect layer 254 of BSI image sensor 250 (FIG. 2B) may be physically joined or coupled to the top of metal-interconnect layer 208 of FSI image sensor 200 (FIG. 2A) to form combined metal-interconnect layer 302. However, unlike metal-interconnect layer 254 of BSI image sensor 250 (e.g., as described with reference to FIG. 2B), combined metal-interconnect layer 302 may include second light pipes 306*a* and 306*b* formed within second metal-interconnect layer 319 of combined metal-interconnect layer 302 to guide light 330*a* and 330*b*—particularly IR and/or NIR light—to pass/travel from second sensor portion 320 to first sensor portion 322 of image sensor 300.

In some embodiments, first sensor portion 322 of image sensor 300 may include first metal-interconnect layer 318 (e.g., a bottom portion of combined metal-interconnect layer 302), which may correspond to a metal-interconnect layer of an FSI image sensor (e.g., metal-interconnect layer 208 as described with reference to FIG. 2A). As such, the bottom portion of combined metal-interconnect layer 302 (e.g., first metal-interconnect layer 318) may include first light pipes 316*a* and 316*b* formed within first metal-interconnect layer 318 of combined metal-interconnect layer 302. As shown in FIG. 3, second light pipes 306*a* and 306*b* may be positioned on top of first light pipes 316*a* and 316*b*. First and second light pipes 316*a* and 316*b*, 306*a* and 306*b* may form a cavity within combined metal-interconnect layer 302 such that first and second light pipes 316*a* and 316*b*, 306*a* and 306*b* may guide light 330*a* and 330*b* from second photodetectors 362*a* and 362*b* to first photodetectors 314*a* and 314*b*.

First photodetectors 314*a* and 314*b* may be configured to receive at least the first portion of light 330*a* and 330*b*. First photodetectors 314*a* and 314*b* may be included or embedded in first epitaxial layer 304 of first sensor portion 322. Further, first epitaxial layer 304 may be formed from or coupled to first substrate layer 340. First epitaxial layer 304 may be in electrical contact with combined metal-interconnect layer 302 via first MOSFET 368.

As described above, second sensor portion 320 of image sensor 300 may be characterized as having two sensor elements corresponding with at least two second photodetectors 362*a* and 362*b*. Similarly, first sensor portion 322 of image sensor 300 may be characterized as having two sensor elements corresponding with at least two first photodetectors 314*a* and 314*b*. In some embodiments, the sensor elements of second sensor portion 320 and corresponding sensor elements of first sensor portion 322 may be aligned. In particular, in such embodiments, first photodetectors 314*a* and 314*b* and first light pipes 316*a* and 316*b* of first sensor portion 322 may be aligned with second photodetectors 362*a* and 362*b* and second light pipes 306*a* and 306*b* of second sensor portion 320 to allow light 330*a* and 330*b* to pass through both sensor portions 320 and 322 of image sensor 300. For example, second photodetector 362*a* of second sensor portion 320 may be aligned with first photodetector 314*a* of first sensor portion 322, and second light pipe 306*a* of second sensor portion 320 may be aligned with first light pipe 316*a* of first sensor portion in order to enable light 330*a* to be captured by both photodetectors 314*a* and 362*a*.

In some embodiments, first light pipe 316*a* and second light pipe 306*a* may be aligned about a first common axis. Similarly, first light pipe 316*b* and second light pipe 306*b* may be aligned about a second common axis. The first and second common axis may be different. In some embodiments, first photodetector 314*a* and second photodetector 362*a* may be aligned about a third common axis. Similarly, first photodetector 314*b* and second photodetector 362*b* may be aligned about a fourth common axis. The third and fourth common axis may be different. The first and third common axis may be the same or different. The second and fourth common axis may be the same or different.

Figure 4:
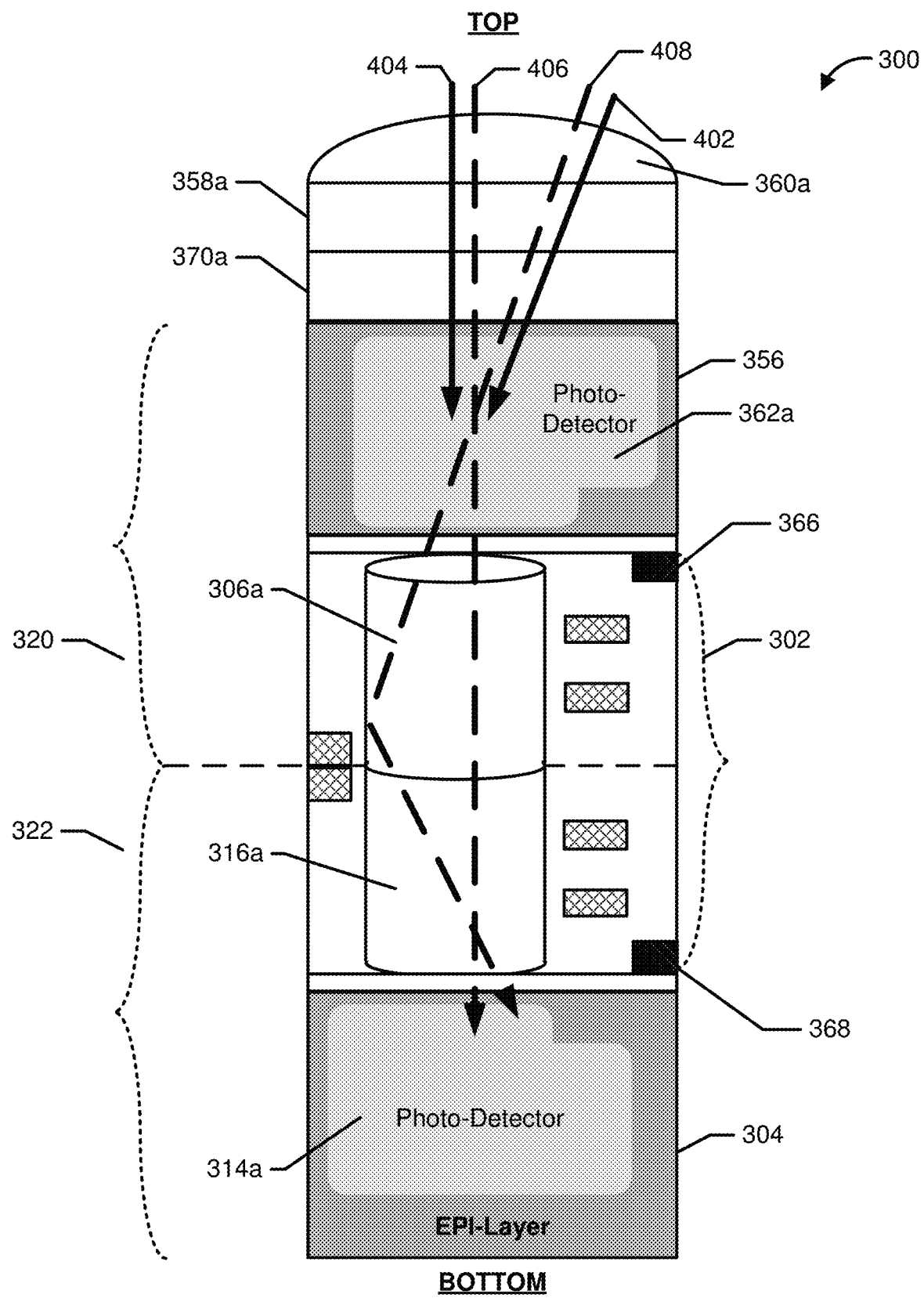
FIG. 4 is a component block diagram showing another cross-sectional view of an image sensor including a dual bandpass filter, according to some embodiments.

FIG. 4 illustrates a blown-up, cross-sectional side view of image sensor 300 described with reference to FIG. 3. Particularly, the illustrated portion of image sensor 300 may focus on a single sensor element of image sensor 300 illustrated in FIG. 3. In some embodiments, image sensor 300 may be configured to leverage the presence of second photodetector 362*a* in second sensor portion 320, as well as first photodetector 314*a* in first sensor portion 322 within the single sensor element, to effectively capture both visible light and IR/NIR light.

In the example illustrated in FIG. 4, both a first portion of received light (referenced herein as NIR/IR light 406 and 408) and a second portion of received light (referenced herein as visible light 402 and 404) may enter from the top of image sensor 300. The received light may include other light, as well. The light may pass through micro-lens 360*a* and the color filter 358*a* (e.g., as described with reference to FIG. 3). The light may then be filtered via optical filter 370*a*. In the instance where optical filter 370*a* includes a dual bandpass filter, optical filter 370*a* may be configured to transmit the first portion of the light within a first wavelength range (e.g., IR/NIR light 406 and 408) and the second portion of the light within a second wavelength range (e.g., visible light 402 and 404), while reflecting or absorbing light outside of the first and second wavelength ranges associated with optical filter 370*a*. For example, only IR/NIR light 406 and 408 and visible light 402 and 404 intended for capture via image sensor 300 may enter second sensor portion 320.

Due to the shorter wavelength of visible light 402 and 404, second epitaxial layer 356 of image sensor 300 may be ground down to a thickness (e.g., three to five micrometers in thickness) to facilitate the capture of visible light 402 and 404 by second photodetector 362a. As such, second photodetector 362a may be configured to receive at least the second portion of light (visible light 402 and 404). Second photodetector 362a may convert the at least received second portion of light (e.g., visible light 402 and 404) into a second electrical signal that is sent to combined metal-interconnect layer 302. The second electrical signal may pass through combined metal-interconnect layer 302 to processing resources (not shown) that may convert the second electrical signal into a second digital signal. This second digital signal may be combined with other digital signals, such as from other sensor elements in image sensor 300, to generate a combined digital image.

However, because the wavelengths of IR/NIR light 406 and 408 are longer than visible light 402 and 404, IR/NIR light 406 and 408 may pass through second photodetector 362a without being detected by second photodetector 362a. Instead, IR/NIR light 406 and 408 (e.g., the first portion of the received light) may continue traveling through light pipes 306a and 316a (e.g., second and first light pipes 306a and 316a, respectively). In some embodiments, light pipes 306a and 316a may be configured to control the directionality of IR/NIR light 406 and 408 in order to reduce signal cross talk between sensor elements.

After passing through light pipes 306a and 316a, first photodetector 314a may be configured to receive at least the first portion of the light (e.g., IR/NIR light 406 and 408). In some embodiments, the thickness of first photodetector 314a may be configured to be thick enough to ensure that IR/NIR light 406 and 408 may be captured/detected. For example, first epitaxial layer 304 may be configured to have a thickness of eight to twenty micrometers. Further, while first photodetector 314a is described as capturing IR/NIR light 406 and 408, in some embodiments, first photodetector 314a may also capture visible light that has passed through second photodetector 362a. First photodetector 314a may receive and convert at least a portion of the first portion of light (e.g., IR/NIR light 406 and 408) into a first electrical signal, which is sent through first MOSFET 368 into combined metal-interconnect layer 302 and driven to processing resources (now shown). These processing resources may convert the first electrical signal into a first digital signal that may be combined with other digital signals from other sensor portions to generate a combined digital image. For example, the first digital signal and the second digital signal may be combined to generate a combined digital signal. A digital image may then be generated based at least in part on the combined digital signal.

In some embodiments, the first and second electrical signals generated from second photodetector 362a and first photodetector 314a may be combined to increase the quality of the digital signal that is ultimately generated from these signals. In particular, because second photodetector 362a may be configured to be particularly sensitive to visible light 402 and 404, and because first photodetector 314a may be positioned within image sensor 300 to effectively sense IR/NIR light 406 and 408, signals representing both visible and NIR/IR light from these photodetectors 314a and 362a may be combined and converted into a digital image. This digital image may reflect a better representation of both visible light information (e.g., day vision) and NIR/IR light information (e.g., night vision) than digital images generated using only one sensor portion (e.g., only one FSI image sensor or BSI image sensor). Also, because both photodetectors 362a and 314a are detecting light from the same environment and/or source, image sensor 300 may effectively capture twice the amount of light as a conventional image sensor without any additional noise due to optical filter 370a rejecting any unwanted or unintended light from the environment. As a result, image sensor 300 may generate more information using smaller photodetectors.

Further, in addition to reducing signal cross talk between photodetectors 362a and 314a, light pipes 306a and 316a may be configured to keep corresponding photodetectors 362a and 314a in first sensor portion 322 and second sensor portion 320 of image sensor 300 aligned. In particular, light pipes 306a and 316a may be configured to enable light that has passed through second photodetector 362a to reach first photodetector 314a. As a result, the electrical signals that photodetectors 314a and 362a generate may correspond to light received from the same environment and/or source, which may improve the overall quality of digital images generated from these electrical signals.

Figure 5:
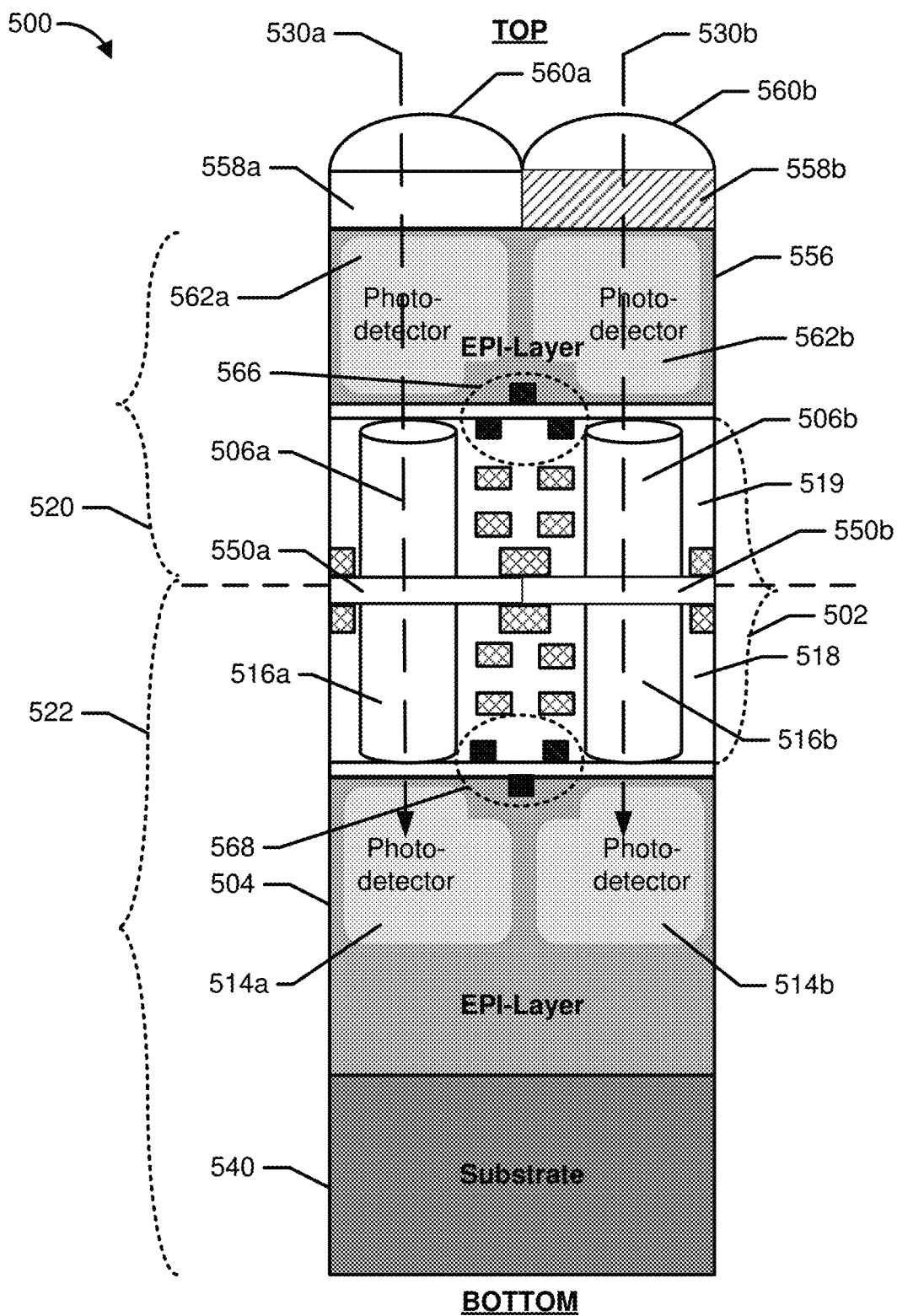
FIG. 5 is a component block diagram showing a cross-sectional view of an image sensor including a narrow bandpass filter, according to some embodiments.

FIG. 5 illustrates a side view of a cross-section of an example image sensor 500. Image sensor 500 may be similar to image sensor 300 of FIGS. 3 and 4, except one or more optical filters 550a and 550b may be disposed within image sensor 500 between first photodetectors 214a and 514b and second photodetectors 562a and 562b (e.g., one or more optical filters 550a and 550b may be disposed within image sensor 500 between first sensor portion 522 and second sensor portion 520), rather than one or more optical filters 370a and 370b disposed above/on top of the second photodetector of the second sensor portion, as shown with reference to image sensor 300.

Image sensor 500 may include first sensor portion 522 and second sensor portion 520. First sensor portion may include first substrate 540, first epitaxial layer 504, first photodetectors 514a and 514b (each corresponding to a sensor element of image sensor 500), first MOSFET 568, first metal-interconnect layer 518, and first light pipes 516a and 516b (each corresponding to a sensor element of image sensor 300). Second sensor portion 520 may include second epitaxial layer 556, second photodetectors 562a and 562b (each corresponding to a sensor element of image sensor 300), second MOSFET 566, second metal-interconnect layer 519, and second light pipes 506a and 506b (each corresponding to a sensor element of image sensor 300).

Light 530a and 530b, prior to being received by image sensor 300, may include reflections of a source light (for example, a source light transmitted via optical transmitter 105 of FIG. 1) and/or may include light from an external light source (reflected or directly). Light 530a and 530b may include a first portion which may include light within a first wavelength range (e.g., a wavelength range associated with NIR/IR light) and a second portion which may include light within a second wavelength range (e.g., a wavelength range associated with visible light). The first and second wavelengths ranges may be different and/or portions of the first and second wavelength ranges may overlap.

Image sensor 500 may include micro-lenses 560a and 560b. In some embodiments intended to capture color images, image sensor 500 may include color filters 358a and 358b. As described above, micro-lenses 560a and 560b may be configured to focus light 530a and 530b entering the top of image sensor 500, and color filters 558a and 558b may be configured to selectively filter out certain colors of light 530a and 530b. Second sensor portion 520 of image sensor 500 may include second epitaxial layer 556, which may have been grinded or thinned to a thickness that is suitable for receiving visible light. For example, second epitaxial layer 556 may have a thickness of approximately three to five micrometers. Second epitaxial layer 556 may include second photodetectors 562a and 562b, which may be configured to receive at least the first portion light 530a and 530b that has passed through micro-lenses 560a and 560b and optional color filters 558a and 558b. As discussed above, second photodetectors 562a and 562b may be included or embedded in second epitaxial layer 556. Second epitaxial layer 556 may be in electrical contact with combined metal-interconnect layer 502 via second MOSFET 566.

In some embodiments, combined metal-interconnect layer 502 of image sensor 500 may be fabricated by affixing or bonding a bottom portion of second metal-interconnect layer 519 of second sensor portion 520 to a top portion of first metal-interconnect layer 518 of first sensor portion 522. For example, the bottom of metal-interconnect layer 254 of BSI image sensor 250 (FIG. 2B) may be physically joined or coupled to the top of metal-interconnect layer 208 of FSI image sensor 200 (FIG. 2A) to form combined metal-interconnect layer 502. However, unlike metal-interconnect layer 254 of BSI image sensor 250 (e.g., as described with reference to FIG. 2B), combined metal-interconnect layer 502 may include second light pipes 506a and 506b formed within second metal-interconnect layer 518 of combined metal-interconnect layer 502 to guide light 530a and 530b— particularly IR or NIR light—to pass/travel from second sensor portion 520 to first sensor portion 522 of image sensor 300.

In some embodiments, first sensor portion 522 of image sensor 500 may include first metal-interconnect layer 518 (e.g., a bottom portion of combined metal-interconnect layer 502), which may correspond to a metal-interconnect layer of an FSI image sensor (e.g., metal-interconnect layer 208 as described with reference to FIG. 2A). As such, the bottom portion of combined metal-interconnect layer 502 (e.g., first metal-interconnect layer 518) may include first light pipes 516a and 516b formed within first metal-interconnect layer 518 of combined metal-interconnect layer 502. As shown in FIG. 5, second light pipes 506a and 506b may be positioned on top of first light pipes 516a and 516b. First and second light pipes 516a and 516b, 506a, 506b may form a cavity within combined metal-interconnect layer 502 and may guide light 530a and 530b from second photodetectors 562a and 562b to first photodetectors 514a and 514b.

In the exemplary embodiment of FIG. 5, image sensor 500 may include one or more optical filters 550a and 550b disposed between first photodetectors 516a and 516b and second photodetectors 562a and 562b. The one or more optical filters may include any optical filters including, but not limited to, interference filters, dichroic filters, absorptive filters, monochromatic filters, infrared filters, ultraviolet filters, longpass filters, bandpass filters, shortpass filters, and other filters. As described above, IR and/or NIR bandpass filters may be configured to transmit a narrow passband associated with the NIR and/or IR spectrum (e.g., such as NIR/IR light). For exemplary purposes only, optical filters 550a and 550b may be referred to as IR or NIR bandpass filters disposed within image sensor 500, but is not meant to be a limitation of this disclosure. Example narrow bandpass filters may include 830 nm, 940 nm, and/or other narrow bandpass filters. In some embodiments, optical filters 550a and 550b may refer to dual bandpass filters or any other filter. In some embodiments, optical filters 550a may refer to one type of filter while optical filter 550b may refer to a second type of filter, different from the first type of filter.

Optical filters 550a and 550b (e.g., for example, IR or NIR narrow bandpass filters) may be disposed between first photodetectors 516a and 516b and second photodetectors 562a and 562b. For example, optical filters 550a and 550b may be disposed on top of first metal-interconnect layer 518, including first light pipes 516a and 516b, of first sensor portion 522, such that optical filters 550a and 550b may be disposed on top of first metal-interconnect layer 518 and/or first light pipes 516a and 516b. Optical filters 550a and 550b may be embedded within first light pipes 516a and 516b. Alternatively, optical filters 550a and 550b may be disposed on the bottom of second metal-interconnect layer 519, including second light pipes 506a and 506b, of second sensor portion 520, such that optical filters 550a and 550b may be disposed on the bottom of second metal-interconnect layer 519 and/or second light pipes 506a and 506b. Optical filters 550a and 550b may be embedded within second light pipes 506a and 506b. By disposing optical filters 550a and 550b (e.g., for example, IR or NIR narrow bandpass filters) between first photodetectors 516a and 516b and second photodetectors 562a and 562b, optical filters 550a and 550b may transmit the first portion of light 530a and 530b (e.g., NIR/IR light) within wavelength ranges associated with optical filters 550a and 550b (e.g., NIR or IR light) while rejecting light outside of the wavelength ranges associated with optical filters 550a and 550b prior to the first portion of light 530a and 530b (e.g., NIR/IR light) entering first photodetectors 514a and 514b.

Optical filters 550a and 550b may be coated or embedded within the top portion the first metal-interconnect layer 518 of first sensor portion 522 prior to bonding first sensor portion 522 and second sensor portion 520, such that optical filters 550a and 550b may be considered "on-chip" of image sensor 500. Alternatively, optical filters 550a and 550b may be coated or embedded within the bottom portion of the second metal-interconnect layer of second sensor portion 520 prior to bonding first sensor portion 522 and second sensor portion 520, such that optical filters 550a and 550b may be considered "on-chip" of image sensor 500. Optical filters 550a and 550b may be coated or embedded within first light pipes 516a and 516b or second light pipes 506a and 506 at the time of forming first light pipes 516a and 516b or second light pipes 506a and 506, such that optical filters 550a and 550b may be considered "on-chip" of image sensor 500. Alternatively, optical filters 550a and 550b may be coated or embedded between first sensor portion 522 and second sensor portion 520 at the time of bonding first sensor portion 522 and second sensor portion 520, such that optical filters 550a and 550b may be considered "on-chip" of image sensor 500. Materials of optical filters 550a and 550b are not particularly limited as long as the materials of optical filters 550a and 550b transmit light within wavelengths suitable for image sensor 500. For example, at least one of the wavelength ranges associated with optical filters 550a and 550b may correspond to a wavelength of the source light transmitted via optical transmitter 105 of FIG. 1.

While FIG. 5 is shown as image sensor 500 having optical filter 550a disposed between second and first light pipes 506a and 516a, respectively, and optical filter 550b disposed between second and first light pipes 506b and 516b, respectively, this is for exemplary purposes only and is not meant to be a limitation of this disclosure. For example, in another example embodiment, optical filters 550a and 550b may be disposed immediately or directly beneath first light pipes 516a and 516b and immediately or directly on top of first photodetectors 514a and 514b. In some embodiments, optical filters 550a and 550b may only be included within image sensor 500 when color filters 558a and 558b are not included within image sensor 500 and/or when optical filters 370a and 370b (e.g., dual bandpass filters of FIG. 3) are not included within image sensor 500. In other embodiments, it may be contemplated that optical filters 550a and 550b may be disposed immediately or directly above or on top of second light pipes 506a and 506b and immediately or directly below second photodetectors 562a and 562b.

Light 530a and 530b, having been filtered by optical filters 550a and 550b, may then enter first sensor portion 522 from second sensor portion 520. In this manner, only light within wavelength ranges associated with optical filters 550a and 550b may enter first sensor portion 522 via optical filters 550a and 550b, such as NIR and/or IR light. First photodetectors 514a and 514b may be configured to receive at least the first portion of light 330a and 330b. First photodetectors 514a and 514b may be included or embedded in first epitaxial layer 504 of first sensor portion 522. Further, first epitaxial layer 504 may be formed from or coupled to first substrate layer 540. First epitaxial layer 304 may be in electrical contact with combined metal-interconnect layer 502 via first MOSFET 368

As described above, second sensor portion 520 of image sensor 500 may be characterized as having two sensor elements corresponding with at least two second photodetectors 562a and 562b. In some embodiments, first light pipe 516a and second light pipe 506a may be aligned about a first common axis. Similarly, first light pipe 516b and second light pipe 506b may be aligned about a second common axis. The first and second common axis may be different. In some embodiments, first photodetector 514a and second photodetector 562a may be aligned about a third common axis. Similarly, first photodetector 514b and second photodetector 562b may be aligned about a fourth common axis. The third and fourth common axis may be different. The first and third common axis may be the same or different. The second and fourth common axis may be the same or different.

Figure 6:
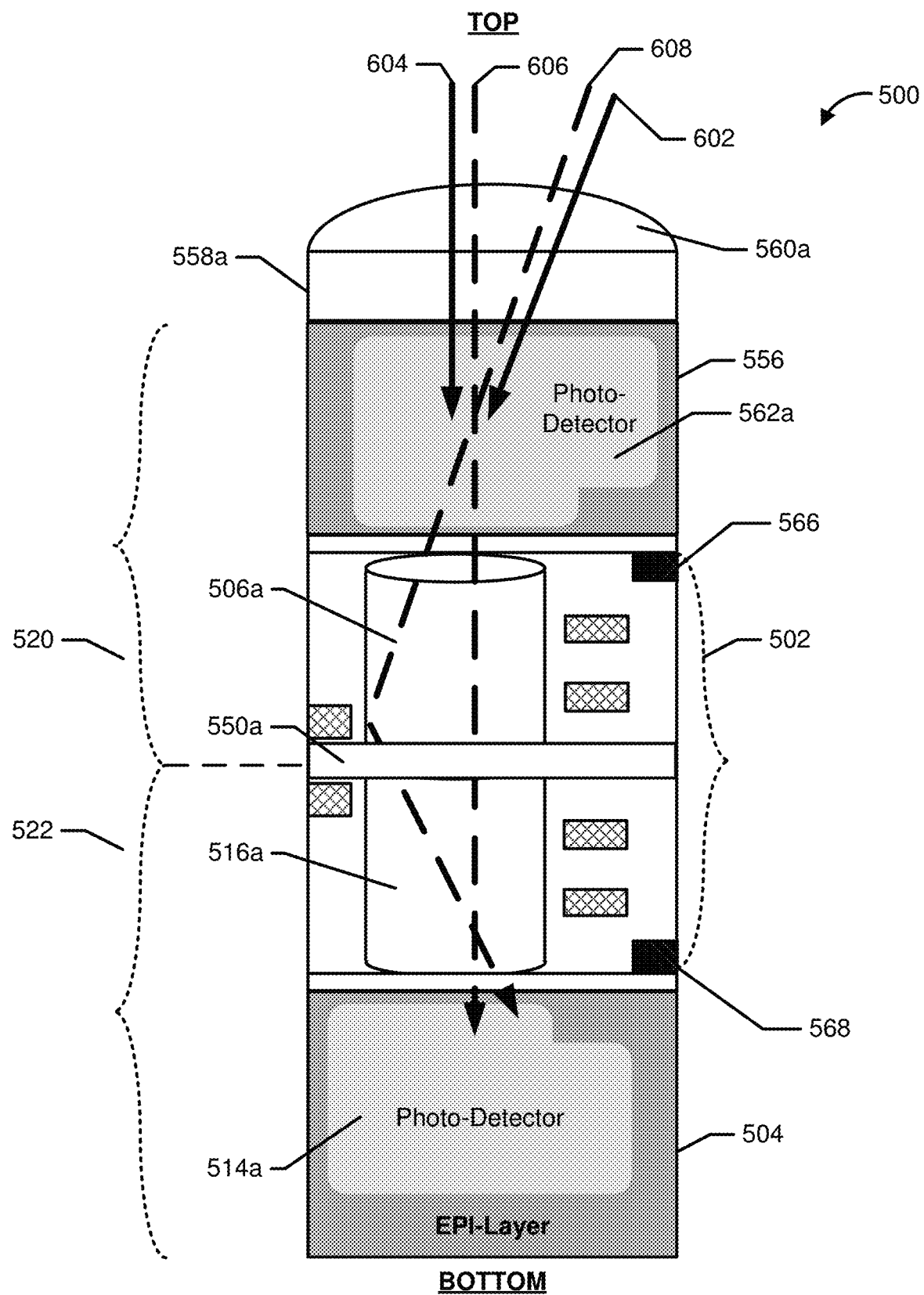
FIG. 6 is a component block diagram showing another cross-sectional view of an image sensor including a narrow bandpass filter, according to some embodiments.

FIG. 6 illustrates a blown-up, cross-sectional side view of image sensor 500 described with reference to FIG. 5. Particularly, the illustrated portion of image sensor 500 may focus on a single sensor element of image sensor 500 illustrated in FIG. 5. In some embodiments, image sensor 500 may be configured to leverage the presence of second photodetector 562a in second sensor portion 520, as well as first photodetector 514a in first sensor portion 522 within the single sensor element, to effectively capture both visible light and IR/NIR light.

In the example illustrated in FIG. 6, both a first portion of received light (referenced herein as IR/NIR light 606 and 608) and a second portion of the received light (referenced herein as visible light 602 and 604) may enter from the top of image sensor 500. The received light may include other light, as well. The light may pass through micro-lens 560a and optional color filter 558a (e.g., as described with reference to FIG. 5). Due to the shorter wavelength of visible light 602 and 604, second epitaxial layer 556 of image sensor 500 may be ground down to a thickness (e.g., three to five micrometers in thickness) to facilitate the capture of visible light 602 and 604 by second photodetector 562a. As such, second photodetector 562a may be configured to receive at least the second portion of light (e.g., visible light 402 and 404). Second photodetector 562a may be configured to convert the at least received second portion of light (e.g., visible light 602 and 604) into a second electrical signal that is sent to combined metal-interconnect layer 502. The second electrical signal may pass through combined metal-interconnect layer 502 to processing resources (not shown) that may convert the second electrical signal into a second digital signal. This second digital signal may be combined with other digital signals, such as from other sensor elements in image sensor 500, to generate a combined digital image.

However, because the wavelengths of IR/NIR light 606 and 608 are longer than visible light 602 and 604, IR/NIR light 606 and 608 may pass through second photodetector 562a without being detected by second photodetector 562a. Instead, IR/NIR light 606 and 608 (e.g., the first portion of the received light) may continue traveling through light pipes 506a and 516a (e.g., second and first light pipes 506a and 516a, respectively). In some embodiments, light pipes 506a and 516a may be configured to control the directionality of IR/NIR light 606 and 608 in order to reduce signal cross talk between sensor elements. In addition, light pipes 506a and 516a may form a collimated guide to reduce the angle of incidence upon which the first portion of the light (e.g., IR/NIR light 606 and 608) may strike/fall incidence upon optical filter 550a.

The light may then be filtered via optical filter 550a. In the instance where optical filter 550a includes an IR or NIR narrow bandpass filter, optical filter 550a may transmit IR/NIR light 606 and 608 within particular wavelength ranges (e.g., the first wavelength range associated with the first portion of light) associated with optical filter 550a while reflecting or absorbing light outside of the wavelength ranges associated with optical filter 550a (e.g., visible light outside of NIR/IR wavelength ranges) such that only IR/NIR light 606 and 608 intended for capture via image sensor 500 may enter first sensor portion 522.

After passing through light pipes 506a and 516a, IR/NIR light 606 and 608 may fall incident upon optical filter 550a. Some optical filters cause light to shift wavelengths when the light strikes the optical filter at an angle of incidence greater than a threshold. In such a case, light intended to be detected by the image sensor is rejected. Second light pipe 506a helps collimate IR/NIR light 606 and 608 to reduce the angle of incidence at which IR/NIR light 606 and 608 strikes optical filter 550a. As discussed above, optical filter 550a being disposed between first light 516a and second light pipe 506a is for exemplary purposes only, as optical filter 550a may be disposed anywhere between first photodetector 514a and second photodetector 562a (e.g., immediately below second photodetector 562a or immediately above first photodetector 514a or embedded somewhere within first light pipe 516a or second light pipe 506a).

Upon the light being filtered by optical filter 550 (e.g., a IR/NIR narrow bandpass filter), first photodetector 514a may be configured to receive at least the first portion of the light (e.g., IR/NIR light 406 and 408). In some embodiments, the thickness of first photodetector 514a may be configured to be thick enough to ensure that IR/NIR light 606 and 608 may be captured/detected. For example, first epitaxial layer 504 may be configured to have a thickness of eight to twenty micrometers. First photodetector 514a may receive and convert at least a portion of the first portion of light (e.g., IR/NIR light 606 and 608) into a first electrical signal, which is sent through first MOSFET 568 into combined metal-interconnect layer 502 and driven to processing resources (now shown). These processing resources may convert the first electrical signal into a first digital signal that may be combined with other digital signals from other sensor portions to generate a combined digital image. For example, the first digital signal and the second digital signal may be combined to generate a combined digital signal. A digital image may then be generated based at least in part on the combined digital signal.

In some embodiments, the first and second electrical signals generated from second photodetector 562a and first photodetector 514a may be combined to increase the quality of the digital signal that is ultimately generated from these signals. In particular, because second photodetector 562a may be configured to be particularly sensitive to visible light 602 and 604, and because first photodetector 514a may be positioned within image sensor 500 to effectively sense IR/NIR light 606 and 608, signals representing both visible and NIR/IR light from these photodetectors 514a and 562a may be combined and converted into a digital image. This digital image may reflect a better representation of both visible light information (e.g., day vision) and NIR/IR light information (e.g., night vision) than digital images generated using only one image sensor. Also, because both photodetectors 562a and 514a are detecting light from the same environment and/or source, image sensor 500 may effectively capture twice the amount of light as a conventional image sensor without any additional noise due to optical filter 550a rejecting any unwanted or unintended light from the environment. As a result, image sensor 500 may generate more information using smaller photodetectors.

Further, in addition to reducing signal cross talk between photodetectors 562a and 514a, light pipes 506a and 516a may be configured to keep corresponding photodetectors 562a and 514a in first sensor portion 522 and second sensor portion 520 of image sensor 500 aligned. In particular, light pipes 506a and 516a may be configured to enable light that has passed through second photodetector 562a to reach first photodetector 514a. As a result, the electrical signal that photodetectors 514a and 562a generate may correspond to light received from the same environment and/or source, which may improve the overall quality of digital images generated from these electrical signals.

Figure 7:
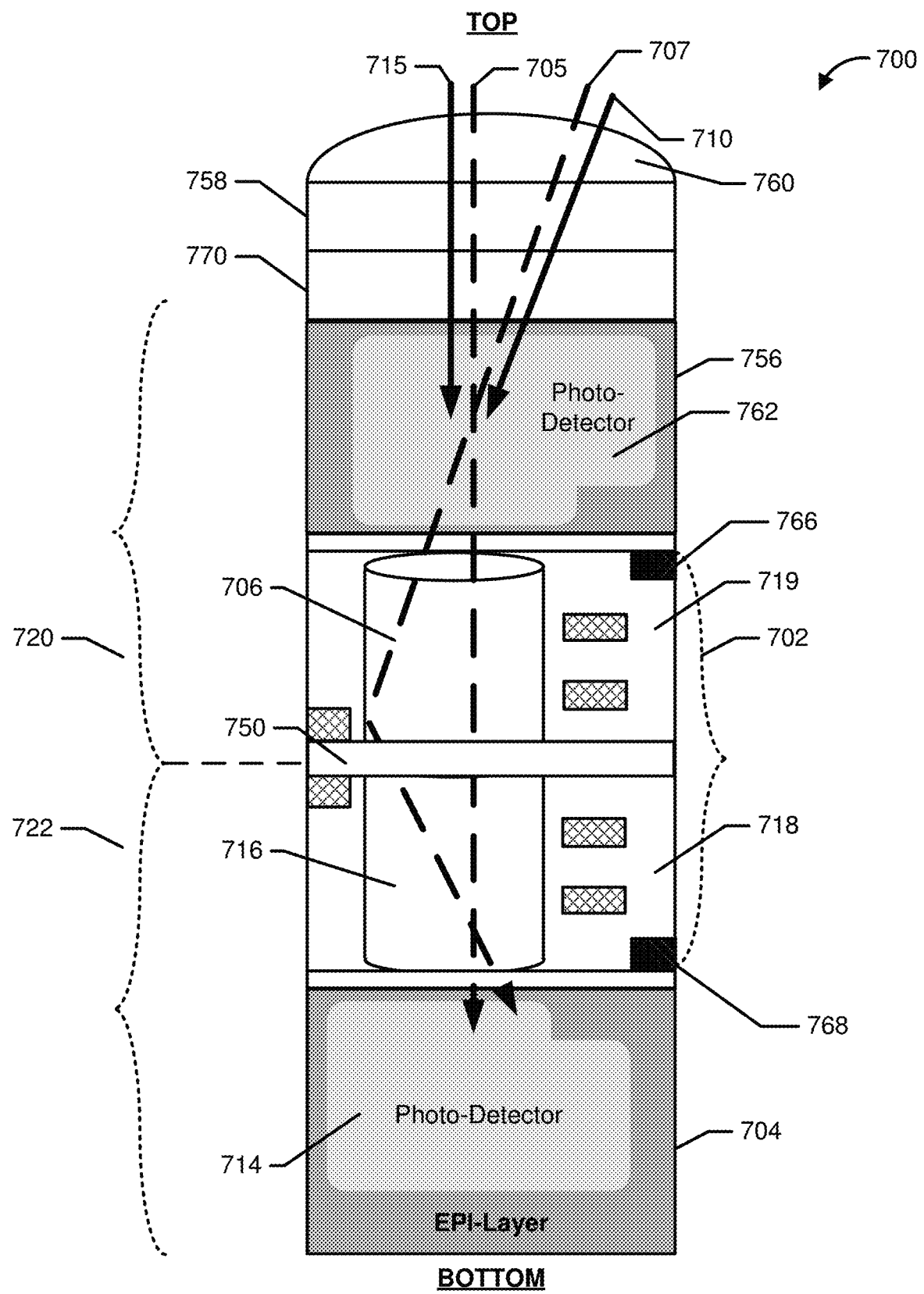
FIG. 7 is a component block diagram showing a cross-sectional view of an image sensor including a dual bandpass filter and a narrow bandpass filter, according to some embodiments.

FIG. 7 illustrates a cross-sectional side view of an image sensor 700, similar to that of image sensor 300 described with reference to FIGS. 3 and 4 and image sensor 500 described with reference to FIGS. 5 and 6. FIG. 7 illustrates an exemplary image sensor 700 that includes both optical filters 370a of FIGS. 3 and 4 and 550a of FIGS. 5 and 6. That is, image sensor 700 may include an optical filter 770 (e.g., a dual bandpass filter) disposed above/on top of second sensor portion 720 and optical filter 750 (e.g., an IR or NIR narrow bandpass filter) disposed between first sensor portion 722 and second sensor portion 720. As discussed above, including both optical filters 770 and 750 may not be necessary, as either optical filter 770 or optical filter 750 may be efficient based on the type of image and/or data intended to be captured by image sensor 700.

The illustrated portion of image sensor 700 may focus on a single sensor element of image sensor 700. As discussed with reference to FIGS. 3 and 5, any number of sensor elements may be included. A single sensor element is used for ease of description. In some embodiments, image sensor 700 may be configured to leverage the presence of second photodetector 762 in second sensor portion 720, as well as first photodetector 714 in first sensor portion 722 within the single sensor element, to effectively capture both visible light and IR/NIR light.

In the example illustrated in FIG. 7, the received light including at least a first portion (e.g., IR/NIR light 705 and 707) and a second portion (e.g., visible light 710 and 715) may enter from the top of image sensor 700. The received light may include other light in addition to the first portion and the second portion. The received light may include reflections of the source light transmitted via optical transmitter 105 of FIG. 1. The received light may include light from an external source, such as lamps or sunlight. As discussed above, the first portion of the received light may include light within a first wavelength range (e.g., within NIR/IR wavelength range) and the second portion of the received light may include light within a second wavelength range (e.g., within the visible light wavelength range). The received light may pass through micro-lens 760 and optional color filter 758. Optical filter 770 may be configured to transmit the first portion of the light and the second portion of the light. In the instance where optical filter 770 includes a dual bandpass filter, optical filter 770 may transmit the first portion of the received light (e.g., IR/NIR light 705 and 707) and the second portion of the received light (e.g., visible light 710 and 715) within wavelength ranges associated with optical filter 770 while reflecting or absorbing light outside of the wavelength ranges associated with optical filter 770 such that only light (e.g., IR/NIR light 705 and 707 and visible light 710 and 715) intended for capture via image sensor 700 may enter second sensor portion 720.

Due to the shorter wavelength of visible light 710 and 715, second epitaxial layer 756 of image sensor 700 may be ground down to a thickness (e.g., three to five micrometers in thickness) to facilitate the capture of visible light 710 and 715 by second photodetector 762. As such, second photodetector 762 may convert visible light 710 and 715 into a second electrical signal that is sent to combined metal-interconnect layer 702. The second electrical signal may pass through combined metal-interconnect layer 702 to processing resources (not shown) that may convert the second electrical signal into a second digital signal. This second digital signal may be combined with other digital signals, such as from other sensor elements in image sensor 700, to generate a combined digital image.

However, because the wavelengths of IR/NIR light 705 and 707 are longer than visible light 710 and 715, IR/NIR light 705 and 707 may pass through second photodetector 762 without being detected by second photodetector 762. Instead, IR/NIR light 705 and 707 (e.g., the first portion of the received light) may continue traveling through light pipes 706 and 716 (e.g., second and first light pipes 706 and 716, respectively) embedded/formed within combined metal-interconnect layer 702 (e.g., second light 706 may be formed within second metal-interconnect layer 719 and first light pipe 716 may be formed within first metal-interconnect layer 718). In some embodiments, light pipes 706 and 716 may be configured to control the directionality of IR/NIR light 705 and 707 in order to reduce signal cross talk between sensor elements. In addition, light pipes 706 and 716 may form a collimated guide to reduce the angle of incidence upon which the first portion of the light (e.g., IR/NIR light 705 and 707) may strike optical filter 750.

The light may then be filtered via optical filter 750. In the instance where optical filter 750 includes an IR or NIR narrow bandpass filter, optical filter 750 may transmit IR/NIR light 705 and 707 within particular wavelength ranges associated with optical filter 750 while reflecting or absorbing light outside of the particular wavelength ranges associated with optical filter 750 (e.g., visible light outside of NIR/IR wavelength ranges) such that only IR/NIR light 705 and 707 intended for capture via image sensor 700 may enter first sensor portion 722.

After passing through light pipes 706 and 716, IR/NIR light 705 and 707 may fall incident upon optical filter 750. Some optical filters cause light to shift wavelengths when light strikes the optical filter at an angle of incidence greater than a threshold. In such a case, light intended to be sensed by the image sensor is rejected. Second light pipe 706 helps collimate IR/NIR light 705 and 707 to reduce the angle of incidence at which IR/NIR light 705 and 707 strikes optical filter 750. As discussed above, optical filter 750 being disposed between first light 716 and second light pipe 706 is for exemplary purposes only, as optical filter 750 may be disposed anywhere between first photodetector 714 and second photodetector 762 (e.g., immediately below second photodetector 762 or immediately above first photodetector 714 or embedded somewhere within first light pipe 716 or second light pipe 706).

Upon the light being filtered by optical filter 750 (e.g., a IR/NIR narrow bandpass filter), first photodetector 714 may be configured to receive at least the first portion of the light (e.g., IR/NIR light 705 and 707). In some embodiments, the thickness of first photodetector 714 may be configured to be thick enough to ensure that IR/NIR light 705 and 707 may be captured/detected. For example, first epitaxial layer 704 may be configured to have a thickness of eight to twenty micrometers. First photodetector 714 may receive and convert at least a portion of the first portion of light (e.g., IR/NIR light 705 and 707) into a first electrical signal, which is sent through first MOSFET 768 into combined metal-interconnect layer 702 and driven to processing resources (now shown). These processing resources may convert the first electrical signal into a first digital signal that may be combined with other digital signals from other image sensors to generate a combined digital image. For example, the first digital signal and the second digital signal may be combined to generate a combined digital signal. A digital image may then be generated based at least in part on the combined digital signal.

In some embodiments, the first and second electrical signals generated from second photodetector 762 and first photodetector 714 may be combined to increase the quality of the digital signal that is ultimately generated from these signals. In particular, because second photodetector 762 may be configured to be particularly sensitive to visible light 710 and 715, and because first photodetector 714 may be positioned within image sensor 700 to effectively sense IR/NIR light 705 and 707, signals representing both visible and NIR/IR light from these photodetectors 714 and 762 may be combined and converted into a digital image. This digital image may reflect a better representation of both visible light information (e.g., day vision) and NIR/IR light information (e.g., night vision) than digital images generated using only one image sensor. Also, because both photodetectors 762 and 714 are detecting light from the same environment and/or source, image sensor 700 may effectively be able to capture twice the amount of light as a conventional image sensor without any additional noise due to optical filters 770 and/or 750 rejecting any unwanted or unintended light from the environment. As a result, image sensor 700 may generate more information using smaller photodetectors.

Further, in addition to reducing signal cross talk between photodetectors 762 and 714, light pipes 706 and 716 may be configured to keep corresponding photodetectors 762 and 714 in first sensor portion 722 and second sensor portion 720 of image sensor 700 aligned. In particular, light pipes 706 and 716 may be configured to enable light that has passed through second photodetector 762 to reach first photodetector 714. As a result, the electrical signal that photodetectors 762 and 714 generate may correspond to light received from the same environment and/or source, which may improve the overall quality of digital images generated from these electrical signals.

Individual image sensor elements within FIG. 7 may be similar to image sensor elements of image sensors 300 and 500. Any image sensor elements of image sensors 300 and 500 may be included within image sensor 700. Similarly, alignment of image sensor elements of FIG. 7 may be similar to alignment of corresponding image sensor elements of image sensors 300 and 500. For example, as described with reference to image sensor 300, second light pipe 706 may be positioned on top of first light pipe 716. Light pipes 706 and 716 may be configured to guide light from second photodetector 162 to first photodetector 714. Second light pipe 706 may be aligned with first light pipe 716 about a first common axis. In some embodiments, first photodetector 714 and second photodetector 762 may be aligned about a second common axis. The first and second common axis may be the same or different.

Figure 8:
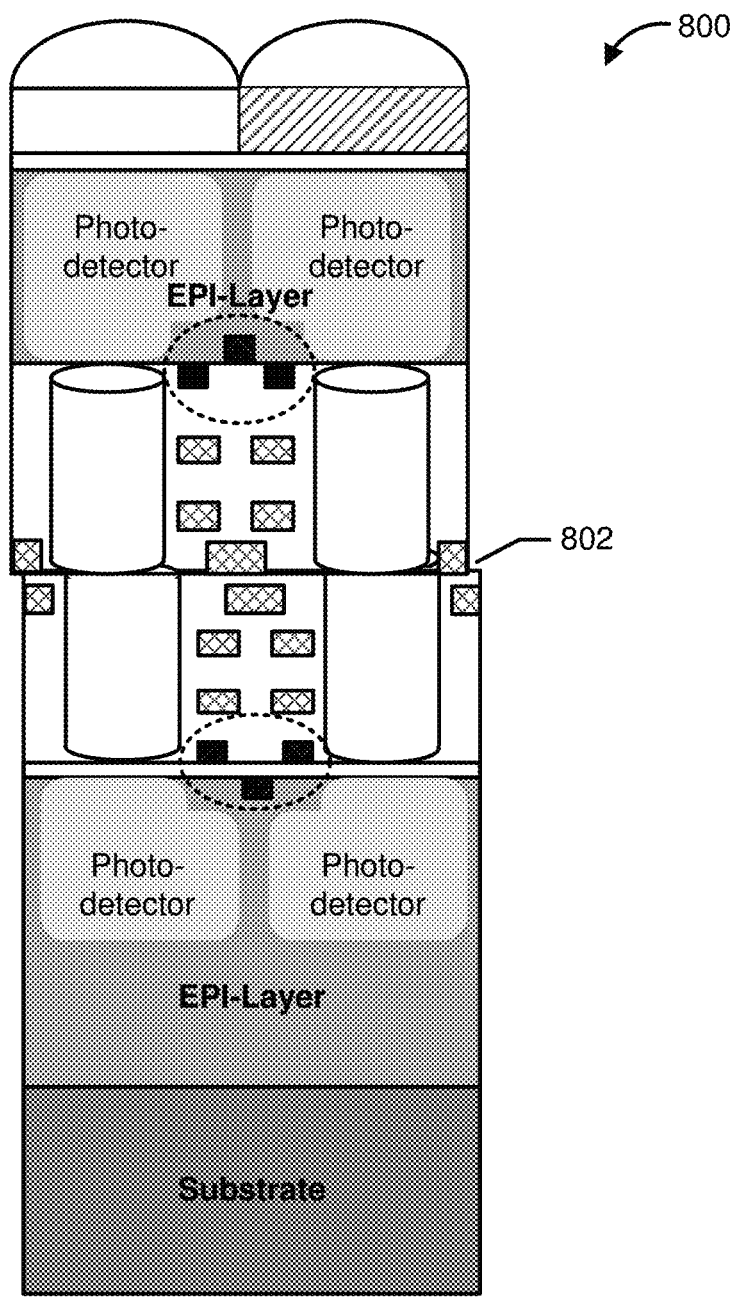
FIG. 8 is a component block diagram showing a cross-sectional view of a misaligned image sensor, according to some embodiments.

FIG. 8 is a cross-sectional side view of an image sensor 800. In some instances, a misalignment may form between the first sensor portion and the second sensor portion when bonding the first sensor portion and the second sensor portion to form the image sensor. Alternatively, the second sensor portion or the first sensor portion may have shifted. The misalignment, shown as 802 in FIG. 8, may cause the first light pipe and the second light pipe to no longer be aligned about a common axis. While the misalignment may be marginal, it may cause light to spill when passing from the second sensor portion to the first sensor portion via the second light pipe to the first light pipe. Further, the gap at misalignment 802 may cause light to be reflected away from the first sensor portion and be reflected back into the second sensor portion. The spilled light and/or reflected light may cause light loss and crosstalk, such that the first sensor portion is not able to detect all of the light passing from the second sensor portion to the first sensor portion.

Figure 9:
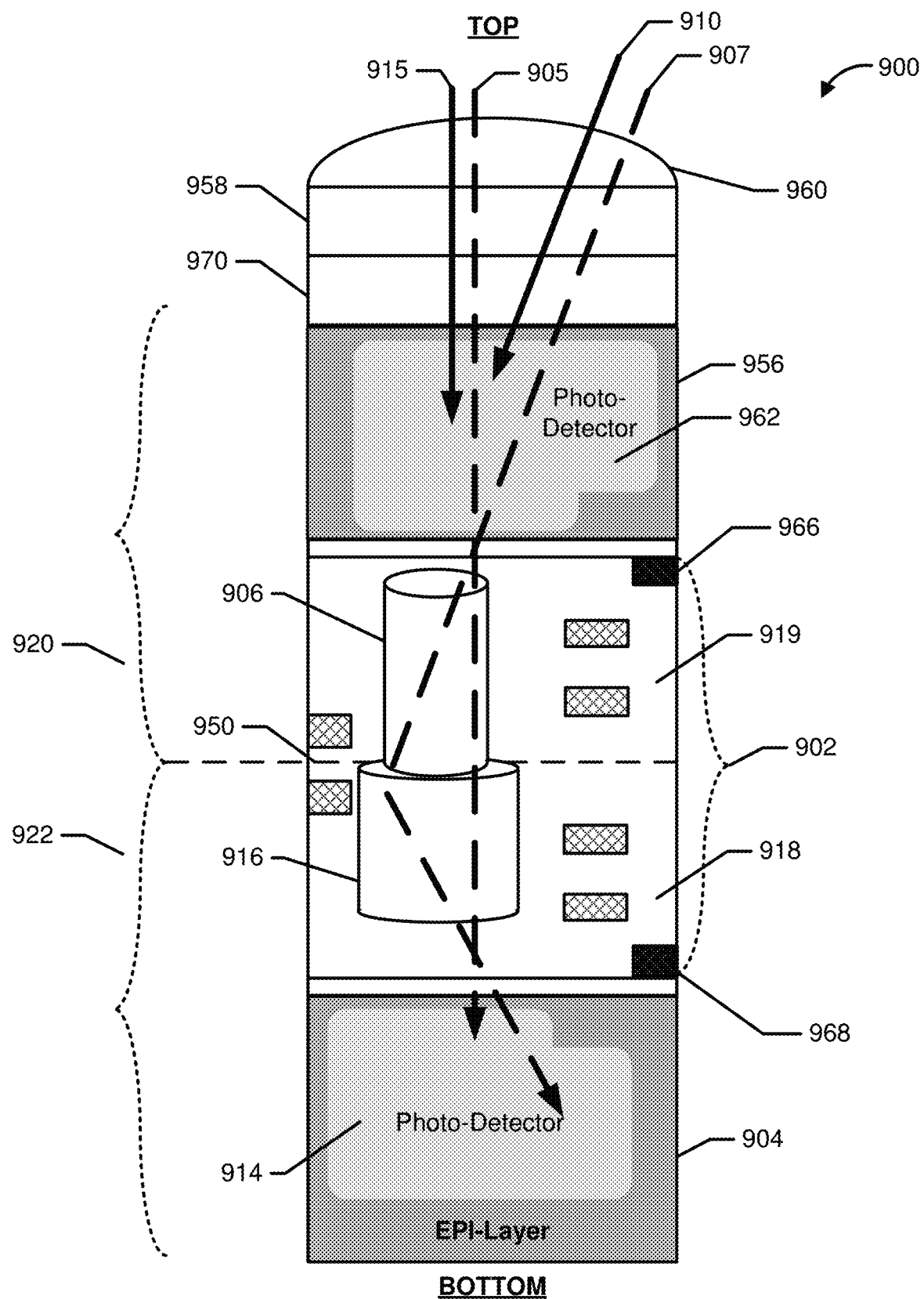
FIG. 9 is a component block diagram showing a cross-sectional view of an image sensor including light pipes of varying widths, according to some embodiments.

FIG. 9 is a cross-sectional side view of an image sensor 900 in accordance with an embodiment to reduce light loss due to misalignment of the stacked image sensor (e.g., the first sensor portion bonded to the second sensor portion). In the example illustrated in FIG. 9, both IR/NIR light 905 and 907 and visible light 910 and 915 may enter from the top of image sensor 900 and may pass through micro-lens 960 and optional color filter 958. IR/NIR light 905 and 907 and visible light 910 and 915 may then be filtered via optical filter 970. In the instance where optical filter 970 includes a dual bandpass filter, optical filter 970 may transmit IR/NIR light 905 and 907 and visible light 910 and 915 within particular wavelength ranges associated with optical filter 970 while reflecting or absorbing light outside of the particular wavelength ranges associated with optical filter 970 such that only IR/NIR light 905 and 907 and visible light 910 and 915 intended for capture via image sensor 900 may enter second sensor portion 920. Due to the shorter wavelength of visible light 910 and 915, second epitaxial layer 956 of image sensor 900 may be ground down to a thickness (e.g., three to five micrometers in thickness) to facilitate the capture of visible light 910 and 915 by second photodetector 962. As such, second photodetector 962 may convert visible light 910 and 915 into a second electrical signal that is sent to combined metal-interconnect layer 902. The second electrical signal may pass through combined metal-interconnect layer 902 to processing resources (not shown) that may convert the second electrical signal into a second digital signal. This second digital signal may be combined with other digital signals, such as from other sensor elements in image sensor 900, to generate a combined digital image.

However, because the wavelengths of IR/NIR light 905 and 907 are longer than visible light 910 and 915, IR/NIR light 905 and 907 may pass through second photodetector 962 without being detected by second photodetector 962. Instead, IR/NIR light 905 and 907 may continue traveling through light pipes 906 and 916 embedded in combined metal-interconnect layer 902 (e.g., second light pipe 906 may be formed within second metal-interconnect layer 919 and first light pipe 916 may be formed within first metal-interconnect layer 918). Second light pip 906 may be positioned on top of first light pipe 916. In some embodiments, light pipes 906 and 916 may be configured to control the directionality of IR/NIR light 905 and 907 in order to reduce signal cross talk between sensor elements. In addition, light pipes 906 and 916 may form a collimated guide to reduce the angle of incidence upon which IR/NIR light 905 and 907 may strike optical filter 950.

In some embodiments, and as shown in FIG. 9, first light pipe 916 may have a first width and second light pipe 906 may have a second width. As shown in FIG. 9, the second width of second light pipe 906 may be smaller than the first width of first light pipe 906. In this manner, first light pipe 916, having a width larger than second light pipe 906, may capture all or as much of the light as possible passing through/guided from second light pipe 906 (having a smaller width relative to first light pipe 916) to first light pipe 916 with minimal light loss, reflection, and/or crosstalk if first sensor portion 922 and second sensor portion 920 are not aligned about a common axis (e.g., if first light pipe 916 and second light pipe 906 are not aligned about a common axis).

While the second width of second light pipe 906 is shown in FIG. 9 to be uniform across second light pipe 906 and the first width of first light pipe 916 is shown to be uniform across first light pipe 916, this is for illustrative purposes only and is not meant to be a limitation of this disclosure. In other embodiments, not depicted, a bottom portion (e.g., surface, opening, etc.) of the second light pipe may be smaller than a top portion (e.g., surface, opening, etc.) of the first light pipe such that either the first light pipe and/or the second light pipe may take any shape and/or form (e.g., a cone and/or funnel shape such that the width of either light pipe varies from top to bottom, etc.) such that light (e.g., IR/NIR light 905 and 907) may pass through a smaller bottom portion/opening of the second light pipe into a larger top portion/opening of the first light pipe, such that the size of the bottom portion of the second light pipe is relative to the size of the top portion of the first light pipe. For example, the top portion of the first light pipe may simply be larger than the bottom portion of the second light pipe and the bottom portion of the second light pipe may simply be smaller than the top portion of the first light pipe.

In some embodiments, image sensor 900 may include optical filter 950 disposed between first photodetector 914 and second photodetector 962. In the exemplary depiction of image sensor 900, optical filter 950 may be disposed between first sensor portion 922 and second sensor portion 920 (e.g., between first light pipe 916 and second light pipe 906). In the instance where optical filter 950 includes an IR or NIR narrow bandpass filter, optical filter 950 may transmit IR/NIR light 905 and 907 within particular wavelength ranges associated with optical filter 950 while reflecting or absorbing light outside of the particular wavelength ranges associated with optical filter 950 (e.g., visible light) such that only IR/NIR light 905 and 907 intended for capture via image sensor 900 may enter first sensor portion 922.

Upon IR/NIR light 905 and 907 being filtered by optical filter 950 (e.g., a IR/NIR narrow bandpass filter), IR/NIR light 905 and 907 may strike first photodetector 914 in first sensor portion 922 of image sensor 900. In some embodiments, the thickness of first photodetector 914 may be configured to be thick enough to ensure that IR/NIR light 905 and 907 may be captured/detected. For example, first epitaxial layer 904 may be configured to have a thickness of eight to twenty micrometers. Further, while first photodetector 914 is described as capturing IR/NIR light 905 and 907, in some embodiments, first photodetector 914 may also capture visible light that has passed through second photodetector 962. Photodetector 914 may capture and convert at least a portion of IR/NIR light 905 and 907 into a first electrical signal, which is sent through MOSFET 968 into combined metal-interconnect layer 902 and driven to processing resources (now shown). These processing resources may convert the first electrical signal into a first digital signal that may be combined with other digital signals from other image sensors to generate a combined digital image.

In some embodiments, the first and second electrical generated from second photodetector 962 and first photodetector 914 may be combined to increase the quality of the digital signal that is ultimately generated from these signals. In particular, because second photodetector 962 may be configured to be particularly sensitive to visible light 910 and 915, and because first photodetector 914 may be positioned within image sensor 900 to effectively sense IR/NIR light 905 and 907, signals representing both visible and NIR/IR light from these photodetectors 914 and 962 may be combined and converted into a digital image. This digital image may reflect a better representation of both visible light information (e.g., day vision) and NIR/IR light information (e.g., night vision) than digital images generated using only one image sensor (e.g., only one of a FSI image sensor or BSI image sensor). Also, because both photodetectors 962 and 914 are detecting light from the same environment and/or source, image sensor 900 may effectively be able to capture twice the amount of light as a conventional image sensor without any additional noise due to optical filters 970 and/or 950 rejecting any unwanted or unintended light from the environment.

Figure 10:
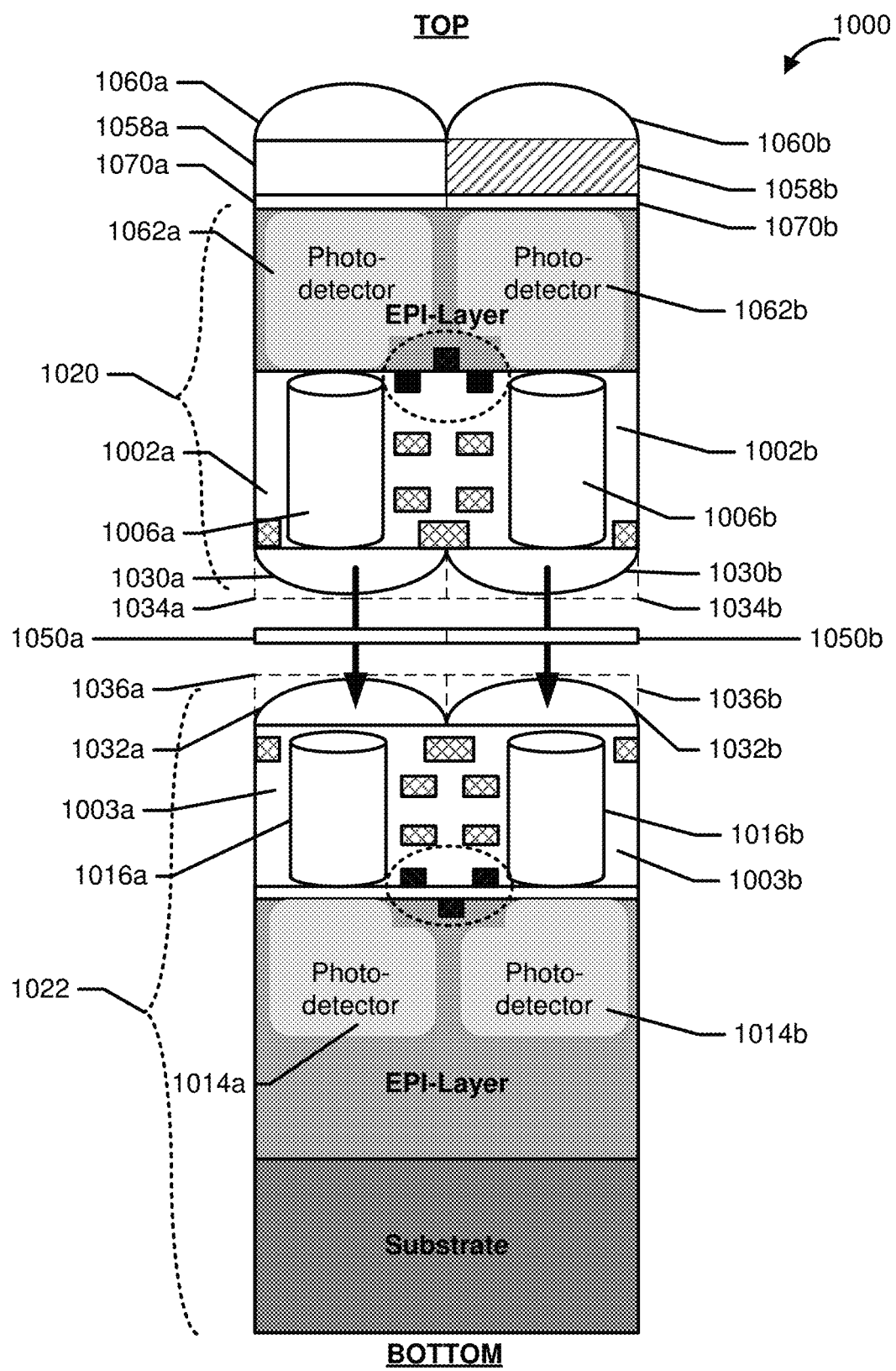
FIG. 10 is a component block diagram showing a cross-sectional view of an image sensor including an inner micro-lens, according to some embodiments.

FIG. 10 is a cross-sectional side view of an image sensor 1000 in accordance with an embodiment to reduce light loss due to misalignment of the stacked image sensor (e.g., the first sensor portion bonded to the second sensor portion). Image sensor 1000 of FIG. 10 is shown to have two sensor elements, but that is not meant to be a limitation of the illustrated embodiment. As discussed above, image sensor 1000 may have any number of sensor elements. In the example illustrated in FIG. 10, both IR/NIR light (not shown) and visible light (not shown) may enter from the top of image sensor 1000 and may pass through micro-lens 1060a and 1060b and optional color filters 1058a and 1058b. If optical filter 1070a and 1070b are included within the image sensor (as depicted in FIG. 10, however this is not meant to be a limitation of the illustrated embodiment), IR/NIR light and visible light may then be filtered via optical filter 1070a and 1070b. In the instance where optical filters 1070a and 1070b include dual bandpass filters, optical filters 1070a and 1070b may transmit IR/NIR light and visible light within particular wavelength ranges associated with optical filters 1070a and 1070b while reflecting or absorbing light outside of the wavelength ranges associated with optical filters 1070a and 1070b such that only IR/NIR light and visible light intended for capture via image sensor 1000 may enter second sensor portion 1020. As discussed above, second photodetectors 1062*a* and/or 1062*b* may convert the visible light into a second electrical signal that is sent to second metal-interconnect layers 1002*a* and 1002*b*. The second electrical signal may pass through second metal-interconnect layers 1002*a* and 1002*b* to processing resources (not shown) that may convert the second electrical signal into a second digital signal. This second digital signal may be combined with other digital signals, such as from other sensor elements in image sensor 1000, to generate a combined digital image.

However, because the wavelengths of IR/NIR light are longer than visible light, IR/NIR light may pass through second photodetectors 1062*a* and 1062*b* without being detected by second photodetectors 1062*a* and 1062*b*. Instead, the IR/NIR light may continue traveling through second light pipes 1006*a* and 1006*b* formed (e.g., embedded) within second metal-interconnect layer 1002*a* and 1002*b*. In some embodiments, second light pipes 1006*a* and 1006*b* may be configured to control the directionality of IR/NIR light passing from second sensor portion 1020 to first sensor portion 1022 in order to reduce signal cross talk between sensor elements.

As shown in FIG. 10, a second inner micro-lens 1030*a* and 1030*b* may be disposed (e.g., coupled) to a bottom portion (e.g., bottom surface) of second sensor portion 1020. More specifically, second light pipe 1006*a* may be coupled to second inner micro-lens 1030*a* and second light pipe 1006*b* may be coupled to second inner micro-lens 1030*b*. A bottom portion (e.g., a bottom opening, bottom surface, etc.) of second light pipe 1006*a* and 1006*b* may be coupled to (e.g., attached, bonded, disposed, etc.) to second inner micro-lens 1030*a* and/or 1030*b*, respectively.

Similarly, a first inner micro-lens 1032*a* and/or 1032*b* may be disposed (e.g., coupled) to a top portion (e.g., top surface) of first sensor portion 1022. More specifically, first light pipe 1016*a* may be coupled to first inner micro-lens 1032*a* and first light pipe 1016*b* may be coupled to first inner micro-lens 1032*b*. A top portion (e.g., a top opening, top surface, etc.) of first light pipe 1016*a* and 1016*b* may be coupled to (e.g., attached, bonded, disposed, etc.) to first inner micro-lens 1032*a* and 1032*b*, respectively.

As shown in FIG. 10, first inner micro-lens 1032*a*, 1032*b* and/or second inner micro-lens 1030*a*, 1030*b* may have a curved shape, perhaps similar to that of a parabola or half an ellipse. First inner micro-lens 1032*a*, 1032*b* and/or second inner micro-lens 1030*a*, 1030*b* may be constructed and/or composed of one or more organic and/or inorganic materials having a high index. The shape and/or materials of first inner micro-lens 1032*a*, 1032*b* and/or second inner micro-lens 1030*a*, 1030*b* may not be particularly limited, as long as light exiting second light pipes 1006*a* and 1006*b* may be focused toward entering first light pipes 1016*a* and 1016*b* via first inner micro-lens 1032*a* and 1032*b*. In this manner, the light may be refracted one or more times via first inner micro-lens 1032*a* and 1032*b* and/or second inner micro-lens 1030*a*, 1030*b* to control the direction of the light such that the light may enter first light pipes 1016*a* and 1016*b* from second light pipes 1006*a* and 1006*b*.

Due to the shape of first micro inner-lens 1032*a* and 1032*b* and second micro inner-lens 1030*a* and 1030*b* not being flat or substantially flat, it may be difficult to bond first sensor portion 1022 and second sensor portion 1020 to form image sensor 1000. In some embodiments, first inner micro-lens 1032*a* and 1032*b* may be enclosed within first substances 1036*a* and 1036*b*. Similarly, in some embodiments, second inner micro-lens 1030*a* and 1030*b* may be enclosed within second substances 1034*a* and 1034*b*. First and second substances 1036*a*, 1036*b* and 1034*a*, 1034*b* may include one or more low index materials having a refractive index at or near 1.5, such as glass. However, the shape and/or materials of the first and second substances are not particularly limited as long as the light may travel through the first and second substances from second inner micro-lens 1030*a* and 1030*b* to first inner micro-lens 1032*a* and 1032*b*. First and second substances 1036*a*, 1036*b* and 1034*a*, 1034*b* may be composed of the same materials or different materials as long as the result is the same (e.g., light may travel through the first and second substances from second inner micro-lens 1030*a*, 1030*b* to first inner micro-lens 1032*a*, 1032*b*).

First substance 1036*a*, 1036*b* may include at least one flat or substantially flat surface. Second substance 1034*a*, 1034*b* may include at least one flat or substantially flat surface such that one of the at least one flat or substantially flat surfaces of first substance 1036*a*, 1036*b* may be bonded (e.g., attached, coupled, etc.) to one of the at least one flat or substantially flat surfaces of second substance 1034*a*, 1034*b*. In this manner, first sensor portion 1022 may be bonded to second sensor portion 1020 via first substance 1036*a*, 1036*b* enclosing first inner micro-lens 1032*a*, 1032*b* and second substance 1034*a*, 1034*b* enclosing second inner micro-lens 1030*a*, 1030*b*.

In the exemplary embodiment of image sensor 1000 as shown in FIG. 10, light passing from second sensor portion 1020 via second light pipes 1006*a* and 1006*b* to first sensor portion 1022 may first pass through second inner micro-lens 1030*a* and 1030*b*, then second substances 1036*a* and 1036*b*, and may then enter first sensor portion 1022 via first substance 1034*a*, 1034*b* and first inner micro-lens 1032*a*, 1032*b*. Because the inner micro-lens may not be substantially flat, it may be difficult to attach and/or bond first sensor portion 1022 to second sensor portion 1020. As such, first substances 1034*a* and 1034*b* and second substances 1036*a* and 1036*b* may provide a flat surface or substantially flat surface in order to attach and/or bond first sensor portion 1022 to second sensor portion 1020. In addition, if a misalignment occurs during the bonding, attaching, or manufacturing process of image sensor 1000 (e.g., during the bonding or attaching of first sensor portion 1022 to second sensor portion 1022), inner micro-lens of first sensor portion 1022 and second sensor portion 1020 may ensure that minimal light is lost while traveling from second light pipe 1006*a*, 1006*b* to first light pipe 1016*a*, 1016*b*.

In some embodiments, as depicted in FIG. 10, image sensor 1000 may include optical filter 1050*a*, 1050*b* disposed (e.g., embedded, coated, etc.) between first substance 1034*a*, 1034*b* and second substance 1036*a*, 1036*b*. However optical filter 1050*a*, 1050*b* being included within image sensor 1000 is not meant to be a limitation of the illustrated embodiment, as optical filter 1050*a*, 1050*b* may not be included within image sensor 1000. In the instance where optical filter 1050*a*, 1050*b* includes an IR or NIR narrow bandpass filter, optical filter 1050*a*, 1050*b* may transmit IR/NIR light within particular wavelength ranges associated with optical filter 1050*a*, 1050*b* while reflecting or absorbing light outside of the wavelength ranges associated with optical filter 1050*a*, 1050*b* (e.g., visible light) such that only IR/NIR light intended for capture via image sensor 1000 may enter first sensor portion 1022 from second sensor portion 1020.

While optical filter 1050*a*, 1050*b* is shown as being disposed between first substance 1034*a*, 1034*b* and second substance 1036*a*, 1036*b* in the exemplary embodiment of image sensor 1000 of FIG. 10, this is not meant to be a limitation of this disclosure. For example, optical filter 1050*a*, 1050*b* may be disposed in another location within image sensor 1000, such as on top of first light pipes 1016*a* and 1016*b* and under first inner micro-lens 1032*a*, 1032*b*. Alternatively, optical filter 1050*a*, 1050*b* may be disposed beneath second light pipe 1006*a*, 1006*b* and on top of second inner micro-lens 1030*a*, 1030*b*. In another embodiment, optical filter 1050*a*, 1050*b* may be disposed at the bottom portion of first light pipe 1016*a*, 1016*b* and above first photodetector layer 1014*a*, 1014*b*. In another embodiment, optical filter 1050*a*, 1050*b* may be disposed under second photodetectors 1062*a*, 1062*b* and on top of second light pipes 1006*a*, 1006*b*. The location and/or position of optical filter 1050*a*, 1050*b* is not particularly limited as long as optical filter 1050*a*, 1050*b* is disposed or embedded within image sensor 1000 between first photodetectors 1016*a*, 1016*b* and second photodetectors 1062*a*, 1062*b* such that the light strikes optical filter 1050*a*, 1050*b* prior to entering first photodetector 1014*a*, 1014*b*.

Upon the IR/NIR light being filtered by optical filter 1050*a*, 1050*b* (e.g., a IR/NIR narrow bandpass filter), the IR/NIR light may strike first photodetectors 1014*a*, 1014*b* in first sensor portion 1022 of image sensor 1000. In some embodiments, the thickness of first photodetectors 1014*a*, 1014*b* may be configured to be thick enough to ensure that the IR/NIR light may be captured/detected. Further, while first photodetectors 1014*a*, 1014*b* is described as capturing the IR/NIR light, in some embodiments, first photodetectors 1014*a*, 1014*b* may also capture visible light that has passed through second photodetectors 1062*a*, 1062*b*. As discussed above, first photodetectors 1014*a*, 1014*b* may convert the visible light into a first electrical signal that is sent to first metal-interconnect layers 1003*a* and 1003*b*. The first electrical signal may pass through first metal-interconnect layers 1003*a* and 1003*b* to processing resources (not shown) that may convert the first electrical signal into a first digital signal. This first digital signal may be combined with other digital signals, such as from other sensor elements in image sensor 1000, to generate a combined digital image. For example, the first digital signal and the second digital signal may be combined to generate a combined digital signal. A digital image may then be generated based at least in part on the combined digital signal.

In some embodiments, the first and second electrical signals generated from first and second photodetectors 1014*a*, 1014*b* and 1006*a*, 1006*b* may be combined to increase the quality of the digital signal that is ultimately generated from these signals. In particular, because second photodetectors 1006*a*, 1006*b* may be configured to be particularly sensitive to visible light, and because first photodetectors 1014*a*, 1014*b* may be positioned within image sensor 1000 to effectively sense IR/NIR light, signals representing both visible and NIR/IR light from these photodetectors 1014*a*, 1014*b* and 1006*a*, 1006*b* may be combined and converted into a digital image. This digital image may reflect a better representation of both visible light information (e.g., day vision) and NIR/IR light information (e.g., night vision) than digital images generated using only one image sensor (e.g., than only using one of an FSI image sensor or a BSI image sensor). Also, because first and second photodetectors 1014*a*, 1014*b* and 1006*a*, 1006*b* are detecting light from the same environment and/or source, image sensor 1000 may effectively capture twice the amount of light as a conventional image sensor without any additional noise due to optical filters 1070*a*, 1070*b* and/or 1050*a*, 1050*b* rejecting any unwanted or unintended light from the environment.

Figure 11:
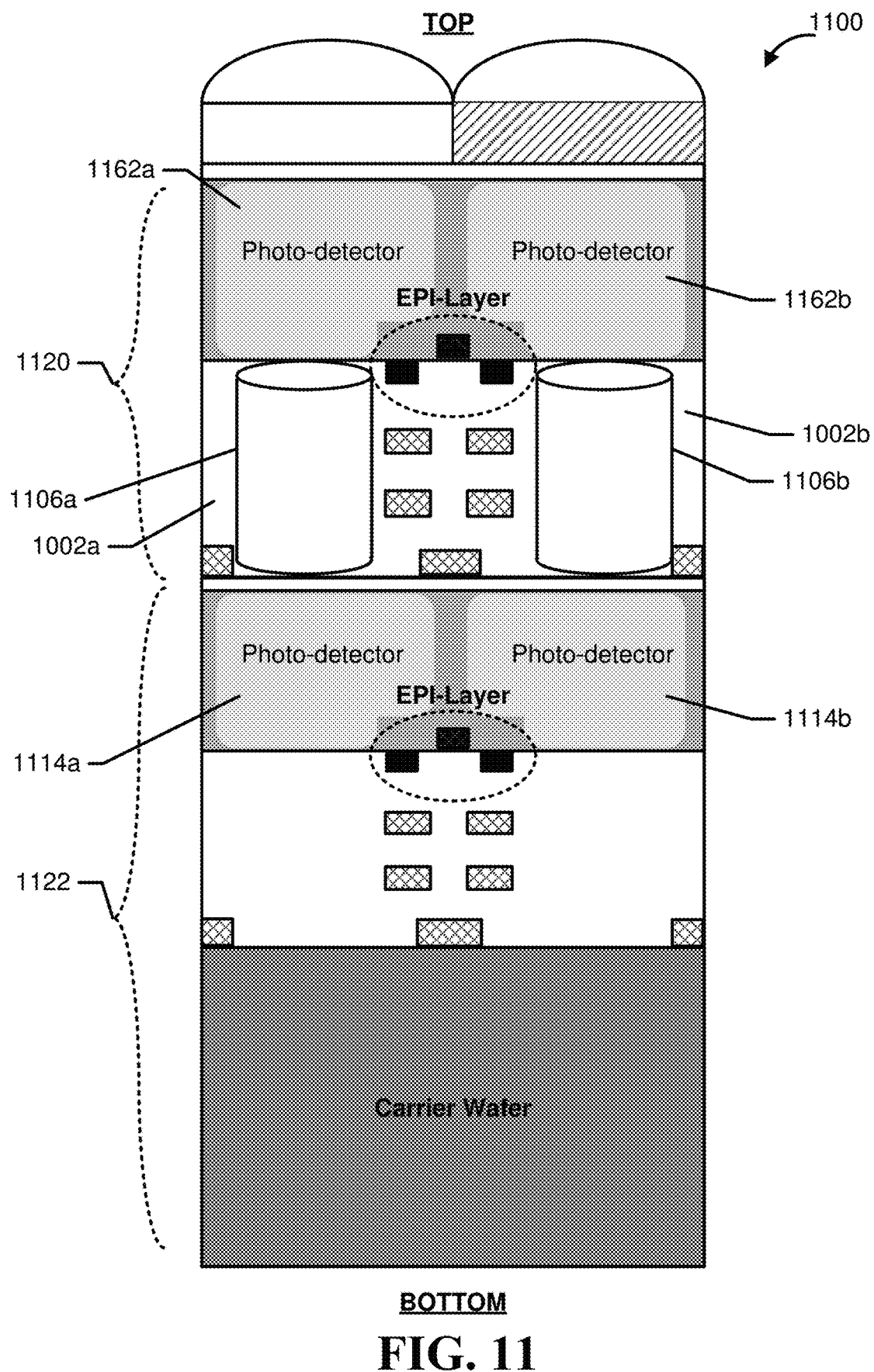
FIG. 11 is a component block diagram showing a cross-sectional view of an image sensor, according to some embodiments.

FIG. 11 is a cross-sectional side view of an image sensor 1100 in accordance with some embodiments. As shown, image sensor 1100 may include first sensor portion 1122 and second sensor portion 1120. First sensor portion 1122 and second sensor portion 1120 may be similar to two BSI image sensors stacked on top of one another. Second sensor portion 1120 of image sensor 1100 may include light pipes 1106*a* and 1106*b* formed within second metal-interconnect layer 1002*a*, 1002*b*. However, first sensor portion 1122 may not include light pipes. Instead, light pipes 1106*a* and 1106*b* may be positioned between second photodetectors 1162*a* and 1162*b* and first photodetectors 1114*a* and 1114*b*, respectively. That is, light pipe 1106*a* may be formed within second metal-interconnect layer 1102*a* below second photodetector 1162*a* and light pipe 1106*b* may be formed within second metal-interconnect layer 1102*b* below second photodetector 1162*b*. Second sensor portion 1120 may be positioned on top of first sensor portion 1122 (e.g., bonded, coupled, attached, etc.) such that light pipe 1002*a* is positioned on top of first photodetector 1114*a* and light pipe 1106*b* is positioned on top of 1114*b*. As such, light pipe 1106*a* may guide light to first photodetector 1114*a* and light pipe 1106*b* may guide light to first photodetector 1114*b* such that the longer wavelengths of NIR/IR light may still be detected by first photodetectors 1114*a* and 1114*b* while the shorter wavelengths of visible light may be detected by second photodetectors 1162*a* and 1162*b*. Less light may be lost due to misalignment of first sensor portion 1122 and second sensor portion 1120 because light pipes 1106*a* and 1106*b* guide light directly to first photodetectors 1114*a* and 1114*b*.

Figure 12:
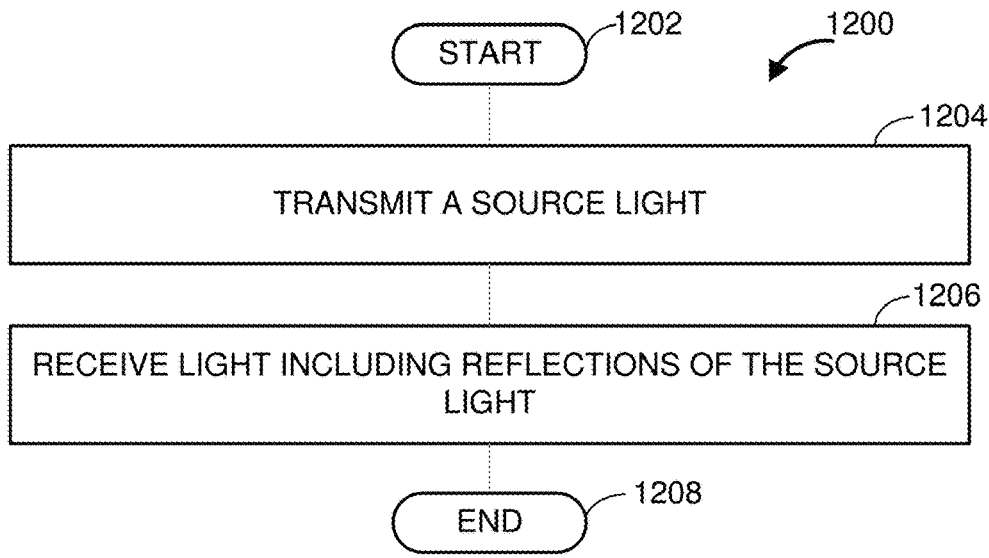
FIGS. 12-13 are flowcharts of methods for capturing an image via an image sensor, according to some embodiments.

FIG. 12 is a flowchart of a method of capturing an image via an image sensor, according to some embodiments. The method 1200 may begin at block 1202 and proceed to block 1204. At block 1204, the method 1200 may transmit a source light. As discussed with reference to FIG. 1, the source light may be transmitted via an optical transmitter. The method 1200 may then proceed to block 1206. At block 1206, the method 1200 may receive light including reflections of the source light. The received light may include light from external sources. As discussed with reference to FIG. 1, the received light may be received at an optical receiver. The optical receiver may include an image sensor, such any of the image sensors described herein. The method 1200 may end at block 1208.

Figure 13:
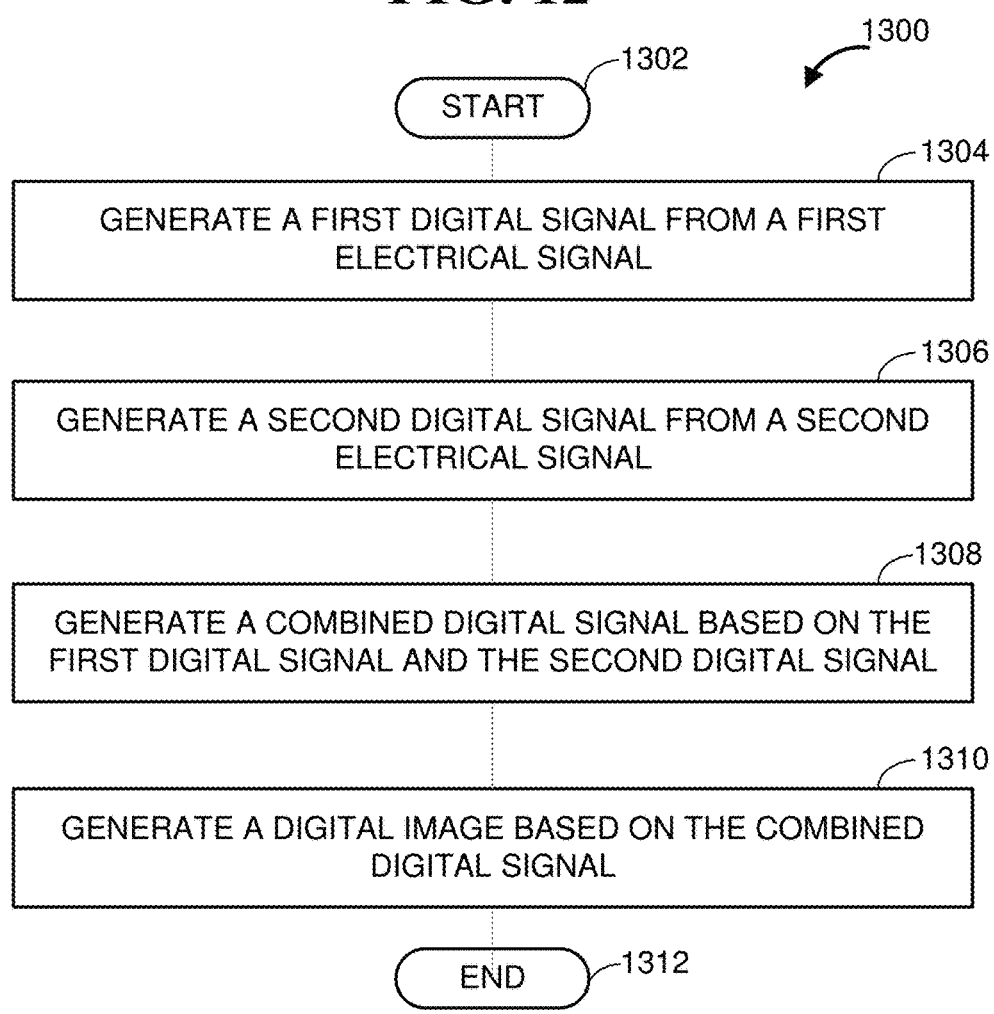

FIG. 13 is a flowchart of a method of capturing an image via an image sensor, according to some embodiments. The method 1300 may begin at block 1302 and proceed to block 1304. At block 1304, the method 1300 may generate a first digital signal from a first electrical signal. As described herein, light may be received at a first photodetector included within a first sensor portion of the image sensor. The first photodetector may convert at least a portion of the received light to a first electrical signal. A first digital signal may be generated from the first electrical signal. The method 1300 may then proceed to block 1306. At block 1306, the method 1300 may generate a second digital signal from a second electrical signal. As described herein, light may be received at a second photodetector included within a second sensor portion of the image sensor. The second photodetector may convert at least a portion of the received light to a second electrical signal. A second digital signal may be generated from the second electrical signal. The method 1300 may then proceed to block 1308. At block 1308, the method 1300 may generate a combined digital signal based on the first digital signal and the second digital signal. The method 1300 may then proceed to block 1310. At block 1310, the method 1300 may generate a digital image based on the combined digital signal. The method 1300 may end at block 1312.

Figure 14:
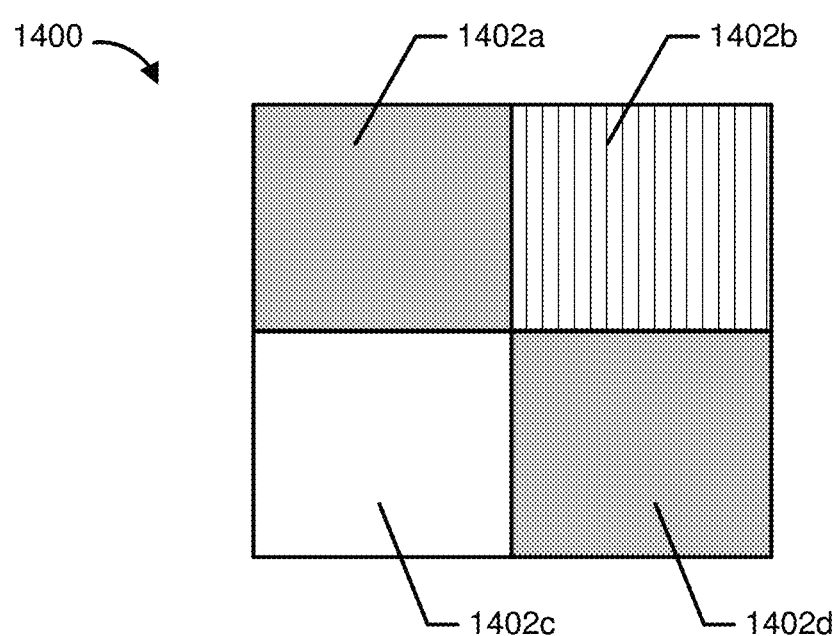
FIG. 14 is a component block diagram showing a top view of an image sensor, according to some embodiments.

FIG. 14 illustrates a top view of image sensor 1400, according to some embodiments. In particular, image sensor 1400 may be arranged as a 2×2 array of sensor elements 1402a, 1402b, 1402c, and 1402d. In some embodiments, the array of sensor elements 1402a-1402d may correspond with one of various color filter arrays or color filter mosaics formed by selectively placing certain color filters on each of the cells in the array. For example, the array of sensor elements 1402a-1402d may correspond to a Bayer filter in which the sensor elements 1402a and 1402d include a color filter that selectively allows only light in the green spectrum to pass through, the sensor cell 1402b may selectively allow only light in the red, NIR, or IR spectrum to pass through, and the sensor cell 1402c may selectively allow only light in the blue spectrum to pass through. Alternatively, the sensor elements 1402a, 1402b, 1402c, and 1402d may be configured with a different color filter array, such as a cyan-yellow-yellow-magenta (CYYM) filter. Further, as described above, each of the sensor elements 1402a-1402d of the image sensor 1400 may correspond with at least one photodetector (not shown) included in the second sensor portion (not shown) and a corresponding photodetector (not shown) included in the first sensor portion (not shown).

While the image sensor 1400 is illustrated in FIG. 14 as having a 2×2 array of sensor elements 1402a-1402d, the image sensor 1400 may be configured with an arbitrary number of one or more sensor elements arranged in a two-dimensional array of sensor elements. For example, the image sensor 1400 may include a 1×1, 640×480, or 4000× 3000 matrix of sensor elements.

Figure 15:
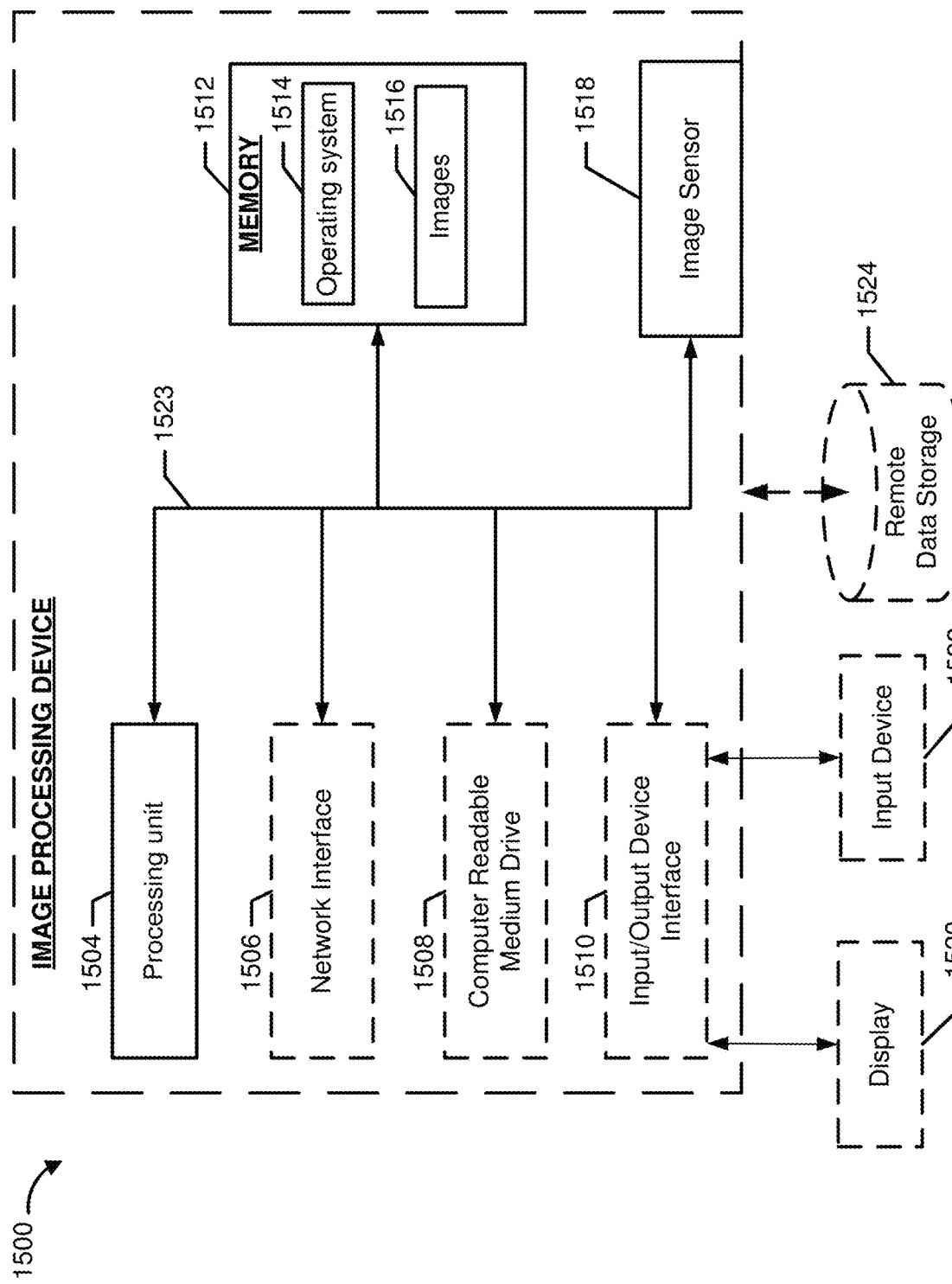
FIG. 15 is a component block diagram illustrating an example of a device suitable for use with some embodiments.

FIG. 15 depicts a general architecture of a device 1500 (e.g., referred to herein as image processing device) that includes an image sensor 1518, according to various embodiments. The general architecture of image processing device 1500 depicted in FIG. 15 includes an arrangement of computer hardware and software components that may be used to implement aspects of the present disclosure. The image processing device 1500 may include many more (or fewer) elements than those shown in FIG. 15. It is not necessary, however, that all of these generally conventional elements be shown in order to provide an enabling disclosure. Although the various components are illustrated as separate components, in some examples two or more of the components may be combined to form a system on chip (SoC). The various components illustrated in FIG. 15 may be formed in one or more microprocessors, application specific integrated circuits (ASICs), field programmable gate arrays (FPGAs), digital signal processors (DSPs), or other equivalent integrated or discrete logic circuitry.

As illustrated, image processing device 1500 (e.g., referred to herein as image processing device) may include a processing unit 1504, an optional network interface 1506, an optional computer readable medium drive 1508, an input/output device interface 1510, an optional display 1520, and an optional input device 1522, all of which may communicate with one another by way of a communication bus 1523. Communication bus 1523 may be any of a variety of bus structures, such as a third-generation bus (e.g., a Hyper-Transport bus or an InfiniBand bus), a second generation bus (e.g., an Advanced Graphics Port bus, a Peripheral Component Interconnect (PCI) Express bus, or an Advanced eXtensible Interface (AXI) bus) or another type of bus or device interconnect. It should be noted that the specific configuration of buses and communication interfaces between the different components shown in FIG. 15 is merely exemplary, and other configurations of devices and/or other image processing devices with the same or different components may be used to implement the techniques of this disclosure.

The processing unit 1504 may comprise a general-purpose or a special-purpose processor that controls operation of image processing device 1500. The network interface 1506 may provide connectivity to one or more networks or computing systems. For example, the processing unit 1504 may receive and/or send information and instructions from/to other computing systems or services via one or more networks (not shown). The processing unit 1504 may also communicate to and from a memory 1512 and may further provide output information for the optional display 1520 via the input/output device interface 1510.

The optional display 1520 may be external to the image processing device 1500 or, in some embodiments, may be part of the image processing device 1500. The display 1520 may comprise an LCD, LED, or OLED screen, and may implement touch sensitive technologies. The input/output device interface 1510 may also accept input from the optional input device 1522, such as a keyboard, mouse, digital pen, microphone, touch screen, gesture recognition system, voice recognition system, or another input device known in the art.

The memory 1512 may include computer- or processor-executable instructions (grouped as modules or components in some embodiments) that the processing unit 1504 may execute in order to perform various operations. The memory 1512 may generally include random-access memory ("RAM"), read-only memory ("ROM"), and/or other persistent, auxiliary, or non-transitory computer-readable media. The memory 1512 may store an operating system 1514 that provides computer program instructions for use by the processing unit 1504 in the general administration and operation of the image processing device 1500. The memory 1512 may further include computer program instructions and other information for implementing aspects of the present disclosure. In addition, the memory 1512 may communicate with an optional remote data storage 1524.

In some embodiments, the memory 1512 may store or include digital representations of images 1516 obtained on the image processing device 1500. In some embodiments, the images 1516 stored in the memory 1512 may include images captured using an image sensor 1518 (e.g., any image sensor described herein). While not shown in FIG. 15, the image processing device 1500 may include optical transmitter 105 and optical receiver 104 of FIG. 1. Optical receiver 104 may include image sensor 1518. The image sensor 1518 may convert visible, NIR, or IR light into a digital signal, which may be stored as one or more images in the memory 1512. The images may be stored in one or more image file formats, such as a bitmap or raster format (e.g., JPEG, GIF, and BMP) or as vector graphic formats (e.g., scalable vector graphics or "SVG" format). In some embodiments, the images 1516 may include images received over a network (not shown) via the network interface 1506. In such examples, the images 1516 may include image files receives from a website, from a network device, or from an optional remote data storage 1524.

In some embodiments, the processing unit 1504 may utilize the input/output device interface 1510 to display or output an image on the display 1520. For example, the processing unit 1504 may cause the input/output device interface 1510 to display one of the images 1516 for a user of the image processing device 1500.

The detailed description is directed to certain specific embodiments of the invention. However, the invention can be embodied in a multitude of different ways. It should be apparent that the aspects herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to, or other than one or more of the aspects set forth herein.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

All of the processes described herein may be embodied in, and fully automated via, software code modules executed by a computing system that includes one or more computers or processors. The code modules may be stored in any type of non-transitory computer-readable medium or other computer storage device. Some or all the methods may be embodied in specialized computer hardware.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

The various illustrative logical blocks and modules described in connection with the embodiments disclosed herein can be implemented or performed by a machine, such as a processing unit or processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable device that performs logic operations without processing computer-executable instructions. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. A computing environment can include any type of computer system, including, but not limited to, a computer system based on a microprocessor, a mainframe computer, a digital signal processor, a portable computing device, a device controller, or a computational engine within an appliance, to name a few.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

Any process descriptions, elements or blocks in the flow diagrams described herein and/or depicted in the attached figures should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. An image sensor including a plurality of sensor elements, each sensor element comprising:
   a first sensor portion including a first photodetector and a first metal-interconnect layer;
   a second sensor portion positioned above the first sensor portion, the second sensor portion including a second photodetector and a second metal-interconnect layer;
   a first filter including a color filter disposed below a microlens and above the second photodetector; and
   a second filter including a dual bandpass filter disposed below the microlens and above the first photodetector.

2. The image sensor of claim 1, wherein the image sensor is configured to receive light including at least a first portion and a second portion, wherein the first portion of the received light includes light within a first wavelength range and the second portion of the received light includes light within a second wavelength range.

3. The image sensor of claim 2, wherein the dual bandpass filter is configured to transmit at least the first portion of the received light and the second portion of the received light.

4. The image sensor of claim 2, further comprising:
   a narrow bandpass filter disposed between the first photodetector and the second photodetector, wherein the narrow bandpass filter is configured to transmit at least the first portion of the received light.

5. The image sensor of claim 2, wherein the first portion of the received light includes infrared or near-infrared light and the second portion of the received light includes visible light.

6. The image sensor of claim 2, wherein the first photodetector is configured to receive at least the first portion of the received light and the second photodetector is configured to receive at least the second portion of the received light.

7. The image sensor of claim 6, wherein the first photodetector is configured to convert the at least first portion of the received light into a first electrical signal and the second photodetector is configured to convert the at least second portion of the received light into a second electrical signal.

8. The image sensor of claim 7, wherein the image sensor is included within a device, the device including an optical transmitter, an optical receiver, and a processor coupled to the image sensor, the processor configured to:
   generate a first digital signal from the first electrical signal;
   generate a second digital signal from the second electrical signal; and
   generate a combined digital signal from the first digital signal and the second digital signal.

9. The image sensor of claim 8, wherein the processor is further configured to:
   generate a digital image based at least in part on the combined digital signal.

10. The image sensor of claim 1, wherein the first sensor portion includes a first light pipe formed within the first metal-interconnect layer and the second sensor portion includes a second light pipe formed within the second metal-interconnect layer, the first and second light pipes configured to guide the received light from the second photodetector to the first photodetector.

11. The image sensor of claim 10, further comprising:
   a narrow bandpass filter disposed between the first light pipe and the second light pipe.

12. The image sensor of claim 1, further comprising:
   a narrow bandpass filter disposed between the first sensor portion and the second sensor portion.

13. A method, comprising:
   transmitting a source light via an optical transmitter; and
   receiving light, including reflections of the source light, via an optical receiver, the optical receiver including an image sensor, the image sensor including a plurality of sensor elements, wherein each sensor element includes:
      a first sensor portion including a first photodetector and a first metal-interconnect layer;
      a second sensor portion positioned above the first sensor portion, the second sensor portion including a second photodetector and a second metal-interconnect layer;
      a first filter including a color filter disposed below a microlens and above the second photodetector; and
      a second filter including a dual bandpass filter disposed below the microlens and above the first photodetector.

14. The method of claim 13, wherein the received light includes at least a first portion of received light and a second portion of received light, wherein the first portion of received light includes light within a first wavelength range and the second portion of the received light includes light within a second wavelength range.

15. The method of claim 14, wherein the dual bandpass filter is configured to transmit the first portion of the received light and the second portion of the received light.

16. The method of claim 14, wherein the image sensor includes:
   a narrow bandpass filter disposed between the first photodetector and the second photodetector, wherein the narrow bandpass filter is configured to transmit at least the first portion of the received light.

17. The method of claim 14, wherein the first portion of the received light includes infrared or near-infrared light and the second portion of the received light includes visible light.

18. The method of claim 14, wherein the first photodetector is configured to receive at least the first portion of the received light and the second photodetector is configured to receive at least the second portion of the received light.

19. The method of claim 18, wherein the first photodetector is configured to convert the at least first portion of the received light into a first electrical signal and the second photodetector is configured to convert the at least second portion of the received light into a second electrical signal.

20. The method of claim 18, wherein the optical transmitter and the optical receiver are included within a device, the device including a processor coupled to the optical receiver, the processor configured to:
   generate a first digital signal from the first electrical signal;
   generate a second digital signal from the second electrical signal; and
   generate a combined digital signal from the first digital signal and the second digital signal.

21. The method of claim 20, wherein the processor is further configured to:
   generate a digital image based at least in part on the combined digital signal.

22. The method of claim 13, wherein the first sensor portion includes a first light pipe formed within the first metal-interconnect layer and the second sensor portion includes a second light pipe formed within the second metal-interconnect layer, the first and second light pipes configured to guide the received light from the second photodetector to the first photodetector.

23. The method of claim 22, wherein the image sensor includes a narrow bandpass filter disposed between the first light pipe and the second light pipe.

24. The method of claim 13, wherein the image sensor includes a narrow bandpass filter disposed between the first sensor portion and the second sensor portion.

25. The method of claim 13, wherein the received light includes light from an external source.

26. An apparatus, comprising:
 means for transmitting a source light via an optical transmitter; and
 means for receiving light, including reflections of the source light, via an optical receiver, the optical receiver including an image sensor, the image sensor including a plurality of sensor elements, wherein each sensor element includes:
  a first sensor portion including a first photodetector and a first metal-interconnect layer;
  a second sensor portion positioned above the first sensor portion, the second sensor portion including a second photodetector and a second metal-interconnect layer;
  a first filter including a color filter disposed below a microlens and above the second photodetector; and
  a second filter including a dual bandpass filter disposed below the microlens and above the first photodetector.

27. The apparatus of claim 26, wherein the first sensor portion includes a first light pipe formed within the first metal-interconnect layer and the second sensor portion includes a second light pipe formed within the second metal-interconnect layer, the first and second light pipes configured to guide the received light from the second photodetector to the first photodetector.

* * * * *